United States Patent
Kasajima

(10) Patent No.: US 8,836,317 B2
(45) Date of Patent: Sep. 16, 2014

(54) CURRENT SENSOR

(75) Inventor: Tamon Kasajima, Hong Kong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 721 days.

(21) Appl. No.: 12/662,800

(22) Filed: May 4, 2010

(65) Prior Publication Data
US 2010/0301835 A1 Dec. 2, 2010

(30) Foreign Application Priority Data
May 27, 2009 (JP) .................................. 2009-128058

(51) Int. Cl.
*G01R 15/18* (2006.01)
*G01R 15/20* (2006.01)

(52) U.S. Cl.
CPC .................................. *G01R 15/207* (2013.01)
USPC ........................ 324/117 R; 324/126; 324/252

(58) Field of Classification Search
CPC .................................................... G01R 33/025
USPC ........... 324/117 R, 117 H, 126–127, 251–252
See application file for complete search history.

(56) References Cited

U.S. PATENT DOCUMENTS

| | | | | |
|---|---|---|---|---|
| 4,749,939 A | * | 6/1988 | Seitz ......................... | 324/117 H |
| 6,184,679 B1 | * | 2/2001 | Popovic et al. ................ | 324/251 |
| 6,323,634 B1 | * | 11/2001 | Nakagawa et al. ....... | 324/117 R |
| 6,759,840 B2 | * | 7/2004 | Marasch et al. .......... | 324/117 H |
| 7,256,602 B2 | * | 8/2007 | Mattes et al. ............ | 324/750.02 |
| 7,265,531 B2 | * | 9/2007 | Stauth et al. .............. | 324/117 H |
| 7,545,136 B2 | * | 6/2009 | Racz et al. ................ | 324/117 H |
| 7,902,811 B2 | * | 3/2011 | Shoji ........................ | 324/117 R |

(Continued)

FOREIGN PATENT DOCUMENTS

| | | |
|---|---|---|
| JP | 62-193109 | 8/1987 |
| JP | 04-118561 | 4/1992 |

(Continued)

OTHER PUBLICATIONS

Suzuki et al (English translation of JP 2008-020403) Jan. 29, 2013.*

(Continued)

*Primary Examiner* — Huy Q Phan
*Assistant Examiner* — Dustin Dickinson
(74) *Attorney, Agent, or Firm* — Nixon & Vanderhye PC

(57) ABSTRACT

A current sensor includes, a current-measured wiring including parallel wiring sections in which portions of the same wiring are arranged in parallel such that electric current to be measured flows therein in opposite directions each other; a magnetism detection unit which is arranged between parallel wirings located in the parallel wiring sections and detects a magnetic field in a direction perpendicular to a plane formed by the parallel wirings; a current detection unit which detects electric current flowing in the current-measured wiring, based on the magnetic field detected by the magnetism detection unit; and a magnetic core surrounding the parallel wiring sections so as to intensify the magnetic field generated around the parallel wirings located in the parallel wiring sections when electric current flows in the wirings. The magnetic core has a pair of plates facing each other over a plane formed by the parallel wirings, the pair of plates having flat and parallel inner faces, and the magnetism detection unit is arranged between the pair of plates of the magnetic core.

13 Claims, 27 Drawing Sheets

(56) References Cited

U.S. PATENT DOCUMENTS

| | | | |
|---|---|---|---|
| 8,193,805 B2* | 6/2012 | Kasajima | 324/207.21 |
| 2005/0045359 A1* | 3/2005 | Doogue et al. | 174/52.1 |
| 2006/0290454 A1* | 12/2006 | Mas et al. | 336/84 R |
| 2007/0044370 A1* | 3/2007 | Shoji | 43/44.98 |
| 2007/0090825 A1* | 4/2007 | Shoji | 324/117 R |
| 2008/0048642 A1* | 2/2008 | Aratani et al. | 324/117 H |
| 2009/0237085 A1* | 9/2009 | Suto | 324/426 |
| 2010/0301836 A1* | 12/2010 | Kern | 324/117 R |

FOREIGN PATENT DOCUMENTS

| | | |
|---|---|---|
| JP | 07-092199 | 4/1995 |
| JP | 08-075403 | 3/1996 |
| JP | 2002-523751 | 7/2002 |
| JP | 2003-526083 | 9/2003 |
| JP | 2005-236134 | 9/2005 |
| JP | 2008-020403 | 1/2008 |
| JP | 2008-116429 | 5/2008 |
| WO | 2008-146809 | 12/2008 |

OTHER PUBLICATIONS

Office Action issued on Apr. 17, 2013 in corresponding Chinese Application No. 201010192638.1 (with translation).

Office Action issued on May 7, 2014 in corresponding Japanese Application No. 2009-128058.

* cited by examiner

PRIOR ART (A)

CURRENT SENSOR

This application claims priority to Japanese Application No. 2009-128058 filed May 27, 2009, the entire contents of which is hereby incorporated by reference in this application.

TECHNICAL FIELD

The present invention relates to current sensors, and in particular, to current sensors using magnetic sensors.

BACKGROUND ART

In recent years, as electronic devices become widely used, demands for current sensors which detect electric current are increasing. Particularly, as the size of the devices to be measured have been reduced, size reduction in the current sensors themselves is indispensable, and cost reduction is also required to be realized by simplifying the structure. Further, it is also required to detect electric current with higher accuracy and higher sensitivity, of course.

An example of a current sensor is disclosed in Japanese Patent Laid-Open No. 2008-20403 (Patent Document 1). FIG. 1A shows the schematic configuration of a magnetic sensor disclosed in Patent Document 1. As shown in FIG. 1A, the magnetic sensor is configured such that a measured current pattern 103, patterned on a printed wiring board 101, is covered with a magnetic core 102 having protruding portions 102a, and a magnetic sensor 104 is disposed at a position on the printed wiring board 101 facing the protruding portions 102a, whereby an output electric signal proportional to a measured current is acquired.

More specifically, when electric current flows in the measured current pattern 103, a magnetic field is generated by the current, and the magnetic field is intensified by the magnetic core 102. Then, as a strong magnetic field is generated in a portion between the protruding portions 102a of the magnetic core 102, that is, in the gap where the magnetic sensor 104 is disposed, it is possible to detect electric current by detecting this magnetic field. In particular, as the magnetic core 102 is processed to have U-shaped grooves in the right and left side faces, the magnetic core 102 is able to be disposed on the printed wiring board 101 without being divided. Further, as the magnetic sensor 104 is covered with the magnetic core 102, external magnetic noise can be blocked.

[Patent Document 1] JP 2008-20403 A

However, the magnetic core 102 of the above current sensor involves a problem that it detects external magnetic noise as well. Specifically, referring to FIG. 1B showing the magnetic core 102 disclosed in Patent Document 1, when an external magnetic field is generated in the vertical direction of the drawing, namely, in a direction indicated by arrows of solid lines, the external magnetic field may pass a part where the protruding portions 102a are formed while being intensified, as indicated by the arrows of dashed lines. As such, as the sensitivity of magnetic sensor becomes higher, it may detect external magnetic noise even in the case where no current flows in the measured current pattern 103. This causes a drop in the accuracy of current detection. Further, the above-described magnetic core 102 has a complicated shape with the protruding portions 102a inside, which also causes an increase in the component costs.

SUMMARY

In view of the above, an exemplary object of the present invention is to provide a highly reliable current sensor in which the above-described problems have been solved so that it can be manufactured in low costs and a false detection of external magnetic noise is prevented.

In order to achieve the exemplary object, a current sensor according to an aspect of the present invention includes, a current-measured wiring including parallel wiring sections in which portions of the same wiring are arranged in parallel such that electric current to be measured flows therein in opposite directions each other; a magnetism detection unit which is arranged between parallel wirings located in the parallel wiring sections and detects a magnetic field in a direction perpendicular to a plane formed by the parallel wirings; a current detection unit which detects electric current flowing in the current-measured wiring, based on the magnetic field detected by the magnetism detection unit; and a magnetic core surrounding the parallel wiring sections so as to intensify the magnetic field generated around the parallel wirings located in the parallel wiring sections when electric current flows in the wirings. The magnetic core has a pair of walls facing each other over a plane formed by the parallel wirings, in which a distance between the pair of walls in a part located between the parallel wirings is the same as or longer than a distance in other parts, and the magnetism detection unit is arranged between the pair of walls of the magnetic core.

Further, a method of manufacturing a current sensor according to another aspect of the present invention includes, with respect to a current-measured wiring including parallel wiring sections in which portions of the same wiring are arranged in parallel such that electric current to be measured flows therein in opposite directions each other, arranging a magnetism detection unit between parallel wirings located in the parallel wiring sections, the magnetism detection unit detecting a magnetic field in a direction perpendicular to a plane formed by the parallel wirings; connecting the magnetism direction unit to a current detection unit which detects electric current flowing in the current-measured wiring based on the magnetic field detected by the magnetism detection unit; and providing a magnetic core which surrounds the parallel wiring sections so as to intensify a magnetic field generated around the parallel wirings located in the parallel wiring sections when electric current flows in the parallel wirings, the magnetic core having a pair of walls facing each other over a plane formed by the parallel wirings, in which a distance between the pair of walls in a part located between the parallel wirings is the same as or longer than a distance in other parts. When providing the magnetic core, the magnetism detection unit is arranged between the pair of walls of the magnetic core.

With the above-described configuration, the present invention is capable of providing a highly accurate current sensor in which manufacturing cost is reduced and detection of external magnetic noise is prevented.

EXEMPLARY EMBODIMENT

<First Exemplary Embodiment>

A first exemplary embodiment of the present invention will be described with reference to FIGS. 2 to 18. FIGS. 2 to 7 are illustrations showing the configuration of a current sensor and assembled states. FIG. 8 is a diagram showing the schematic configuration of the current sensor.

Figure 9:
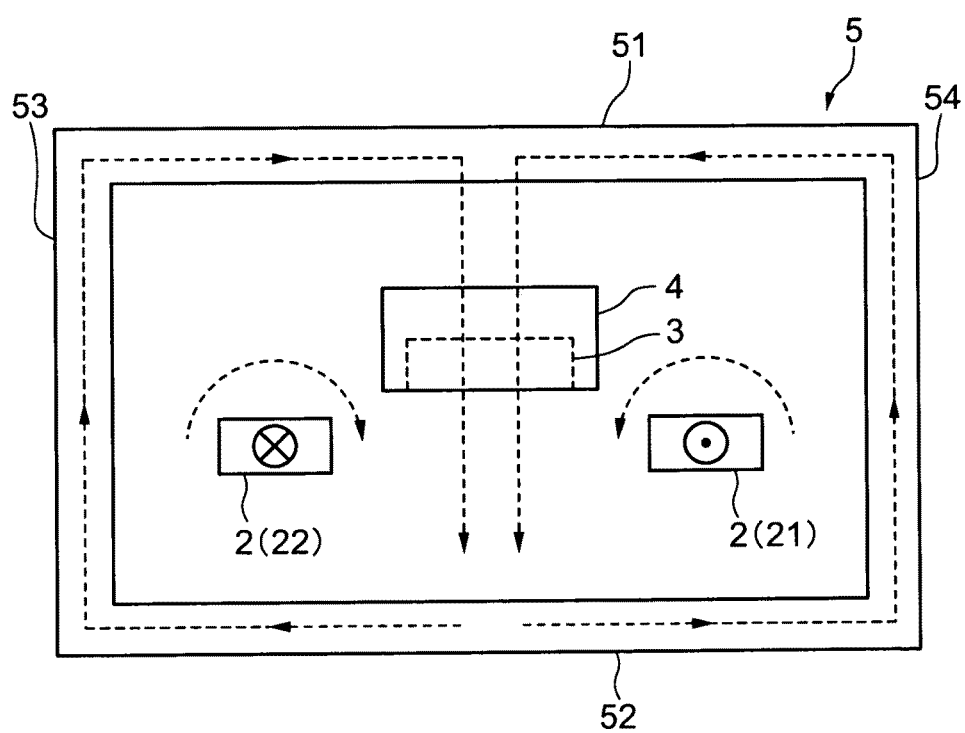
FIG. 9 is an illustration for explaining functions of the magnetic core disclosed in FIGS. 5 and 8.
Figure 10:
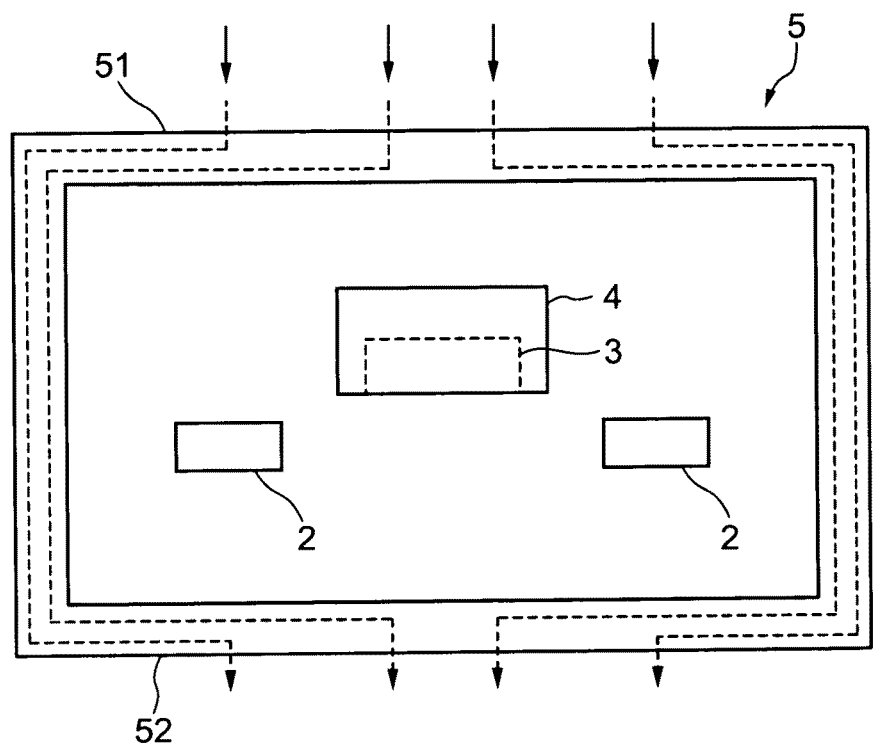
FIG. 10 is an illustration for explaining functions of the magnetic core disclosed in FIGS. 5 and 8
Figure 11:
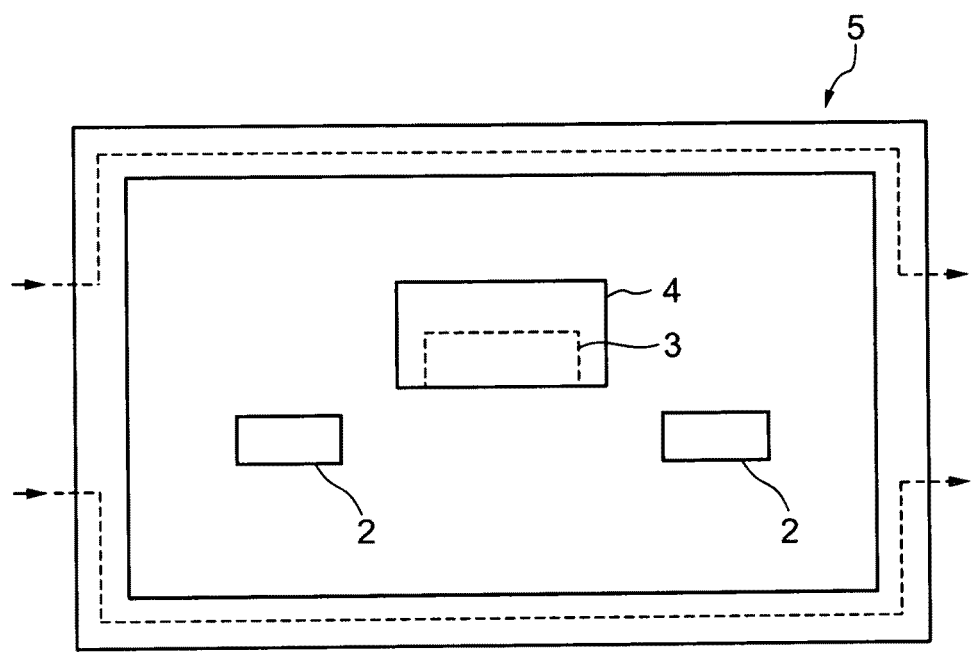
FIG. 11 is an illustration for explaining functions of the magnetic core disclosed in FIGS. 5 and 8.

FIGS. 9 to 11 are illustrations showing states of magnetic fields generated with respect to the current sensor. FIGS. 12 to 18 are illustrations for explaining detailed configuration and operation of a magnetic sensor constituting the current sensor.

Figure 2:
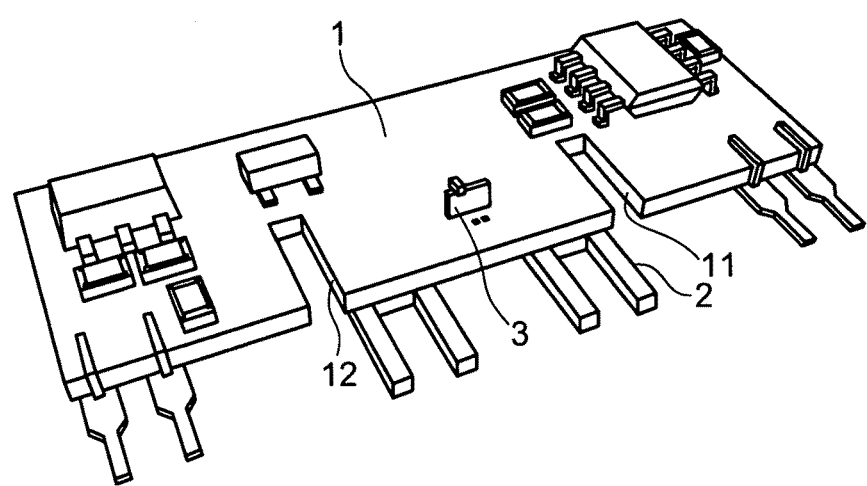
FIG. 2 is an illustration showing the configuration and an assembled state of a current sensor according to a first exemplary embodiment.
Figure 3A:
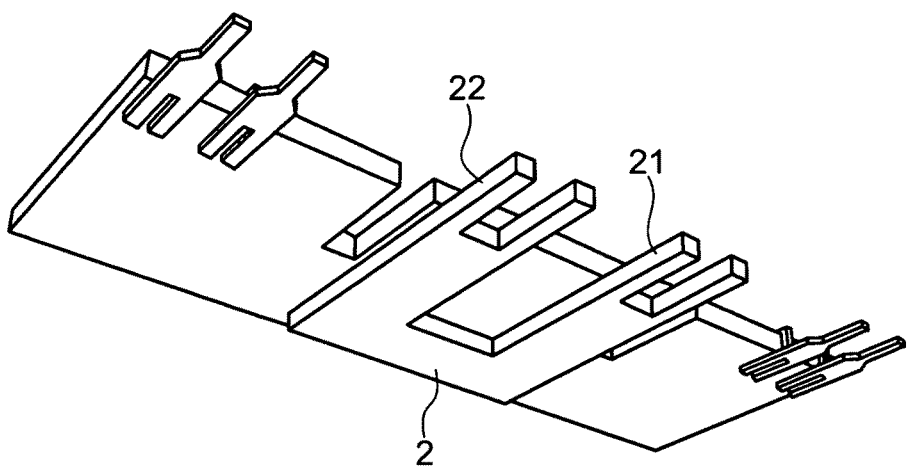
FIG. 3A is an illustration showing the configuration and an assembled state of the current sensor according to the first exemplary embodiment.

First, the configuration and assembling procedures of a current sensor will be described with reference to FIGS. 2 to 7. FIG. 2 shows a top surface of a substrate 1 serving as the base of the configuration of the current sensor, and FIG. 3A shows a back surface thereof. As shown in FIGS. 2 and 3A, the substrate 1 is a rectangular, thin plate member. As shown in FIG. 3A, the rear surface of the substrate 1 is provided with a U-shaped current bar 2 which is mounted along the surface of the substrate 1.

The current bar 2 (current-measured wiring) works as wiring in which electric current flows, has terminals at both ends, and is capable of being connected to terminals formed in a device to be measured (current-measured device). When the current bar 2 is connected to the terminals of the device to be measured, as current flows from one end to the other end, the current sensor, which is the present invention, works to measure the value of the current flowing from the device. It should be noted that the current sensor of the present invention may be built in a device to be measured so as to be provided on a steady basis, or may be provided to the device when required.

Specifically, the current bar 2 is formed in a U-shape. As such, two linear portions 21 and 22, where the respective end portions locate, are parallel to each other, forming parallel arrangement portions. As the current bar 2 forms the same wiring, electric current flows in opposite directions to each other in the parallel linear portions 21 and 22.

As the current bar 2 is mounted on the back surface of the substrate 1, the current bar 2 itself, that is, a plane defined by the two linear portions 21 and 22, is in a parallel positional relationship with the surface of the substrate 1. As such, as described above, when electric current flows in opposite directions each other in the parallel linear portions 21 and 22, a magnetic field is generated to surround the linear portions 21 and 22. In the center part between the linear portions 21 and 22, the direction of the electric field is almost perpendicular to the substrate 1.

It should be noted that the configuration of the current bar 2 is not limited to that described above. The current bar 2 may be formed of a trace wiring integrally formed on the substrate 1. Further, the shape of the current bar 2 is not limited to a U-shape, and the current bar 2 may be formed of portions of the same wiring arranged in parallel such that electric current flows in opposite directions to each other.

Figure 3B:
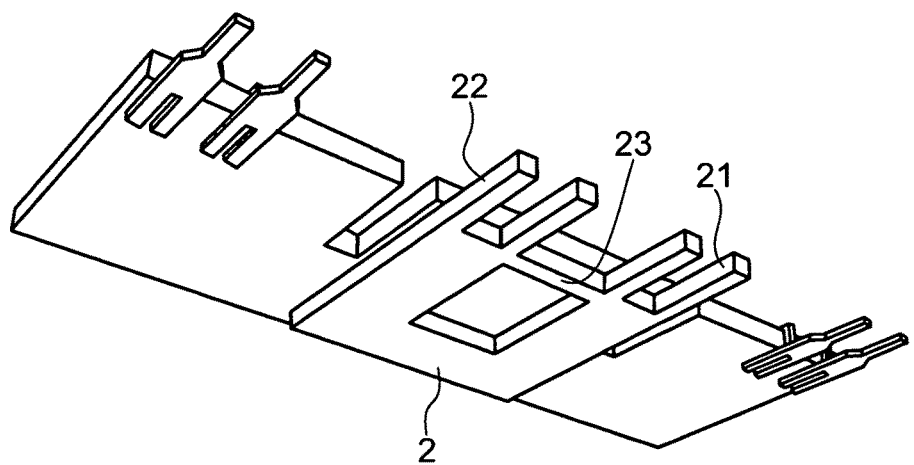
FIG. 3B is an illustration showing the configuration and an assembled state of the current sensor according to the first exemplary embodiment.

Further, in order to control electric current flowing in the liner portions 21 and 22 constituting the current bar 2, a connecting wiring section 23 for connecting one end of a terminal and another end of the other terminal of the current bar 2 may be formed in a location adjacent to the one end and the other end of the terminals of the current bar 2, as shown in FIG. 3B. With this structure, if electric current flowing between the terminals of the current bar 2 is large, the electric current flowing in the linear portions 21 and 22 of the current bar 2 can be reduced. As such, this structure is desirable for measuring direct large current. In order to reduce the manufacturing costs, it is desirable that the connecting wiring section 23 and the current bar 2 are integrally formed.

The substrate 1 also has notches 11 and 12 which are cut-outs having a predetermined width and extending in parallel with the linear portions 21 and 22 on the outside of the current bar 2, that is, adjacent to the linear portions 21 and 22, specifically. The notches 11 and 12 are formed by cutting the substrate 1 to the inside thereof with a constant width for mounting a magnetic core 5 to be described below, into which walls 53 and 54 of the magnetic core 5 are to be inserted.

On the surface of the substrate 1, a magnetic sensor 3 (magnetism detecting unit) is mounted at a position corresponding to the spacing part of the current bar 2, that is, at the center between the parallel linear portions 21 and 22 in particular. The magnetic sensor 3 is able to detect a magnetic field in a direction vertical to the substrate 1. Accordingly, as the orientation of the magnetic field generated by electric current flowing in the current bar 2 is a direction perpendicular to the substrate 1 between the two linear portions 21 and 22, the magnetic field can be detected. A circuit which detects an output from the magnetic sensor 3 is mounted on the substrate 1 as a controller 10 (see FIG. 8), and the magnetic sensor 3 mounted on the substrate 1 is connected to the controller 10. The controller 10 will be described in detail below.

In this exemplary embodiment, although a GMR (Giant Magneto Resistive effect) element is used as an example of the magnetic sensor 3 as described below, any magnetic sensors capable of detecting a magnetic field generated in a direction perpendicular to the substrate 1 may be used, including a hall element and a TMR (Tunnel Magneto-Resistance) element, may be used. The configuration of the magnetic sensor 3 will be described in detail below.

Figure 4:
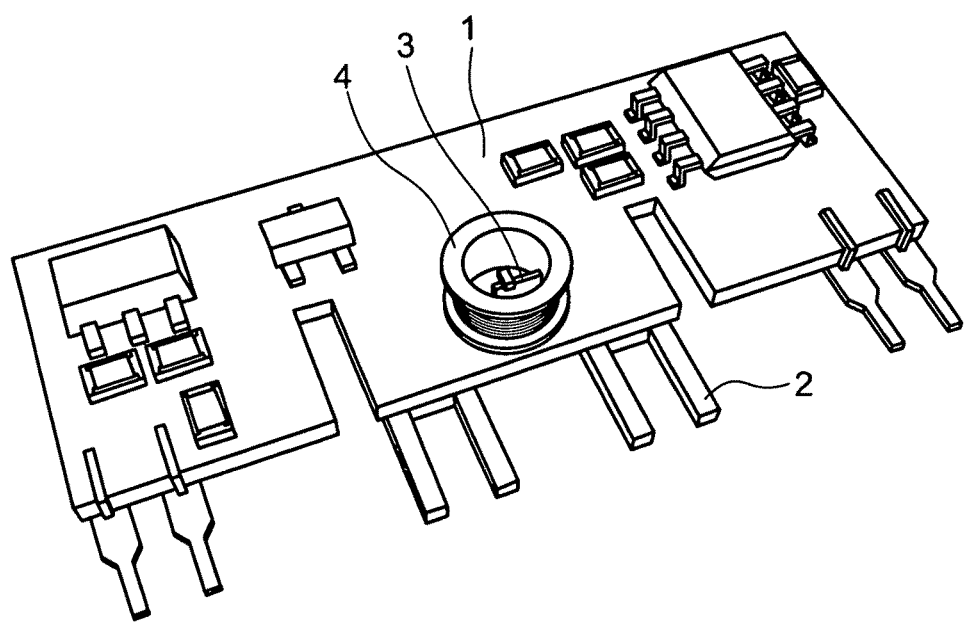
FIG. 4 is an illustration showing the configuration and an assembled state of the current sensor according to the first exemplary embodiment.

Further, as shown in FIG. 4, an almost cylindrical coil 4 is mounted on the top surface of the substrate 1. Specifically, the coil 4 is formed by winding around the outer circumference of an almost cylindrical bobbin. The coil 4 may be an air core coil without a bobbin. The coil 4 is mounted on the substrate 1 such that the magnetic sensor 3 is positioned at the center of the hollow interior portion thereof. The height of the coil 4 is set such that an element formation surface on which elements for detecting a magnetic field are formed in the magnetic sensor 3, described below, is positioned at the center in the height direction of the coil 4. As electric current flows in the coil 4 and the current bar 2 arranged on the top and back surfaces of the substrate 1 respectively, in at least the portions of the substrate 1 where the coil 4, the magnetic sensor 3, and the current bar 2 are mounted, the top and back surfaces thereof are insulated from each other.

Then, when electric current flows in the coil 4, a magnetic field is generated inside and around the coil 4. In particular, in the center part of the hollow portion of the coil 4, a magnetic field in a direction perpendicular to the substrate 1 is generated. As such, by controlling the direction and the intensity of the current flowing in the coil 4, a magnetic field is generated in the coil 4 in the opposite direction to the magnetic field in the direction perpendicular to the substrate 1 which has been generated by electric current flowing in the current bar 2, so that the magnetic field generated by the current bar 2 can be offset.

Then, as described above, a circuit which controls electric current flowing in the coil 4 is mounted on the substrate 1 as the controller 10 (see FIG. 8), and the coil 4 mounted on the substrate 1 is connected to the controller 10. The controller 10 has a function of detecting an output from the magnetic sensor 3, and controls to flow electric current to the coil 4 according to the output. Specifically, the controller 10 controls a value of electric current to flow in the coil 4 such that the magnetic field generated by the current bar 2 is offset by the magnetic field generated by the coil 4 so that the value of the magnetic field detected by the magnetic sensor 3 becomes "0". The specific operation of the controller 10 will be described below.

The controller 10 also has a function of detecting a value to which a predetermined operation is applied based on the electric current flowing in the coil 4 such that the value of the magnetic field detected by the magnetic sensor 3 becomes "0", as a current value flowing in the current bar 2, and outputting the value to the outside. This means that the controller 10 has a function of detecting electric current flowing in the current bar 2 based on the electric current flowing in the coil 4. In other words, according to this function, as the controller 10 controls the current value to flow in the coil 4 according to the value of the magnetic field detected by the magnetic sensor 3 to thereby detect electric current flowing in the current bar 2, it can be said that the controller 10 detects electric current flowing in the current bar 2 based on the magnetic field detected by the magnetic sensor 3.

In this exemplary embodiment, as the current value flowing in the current bar 2 is detected based on the current value flowing in the coil 4, the coil 4 and the controller 10 work as a current detection unit. However, the controller 10 may detect a value of the electric current flowing in the current bar 2 by applying predetermined operation to the value of the magnetic field detected by the magnetic sensor 3. In that case, although the controller 10 does not have a function of controlling the coil (coil control unit), the controller 10 solely works as the current detection unit.

Figure 5:
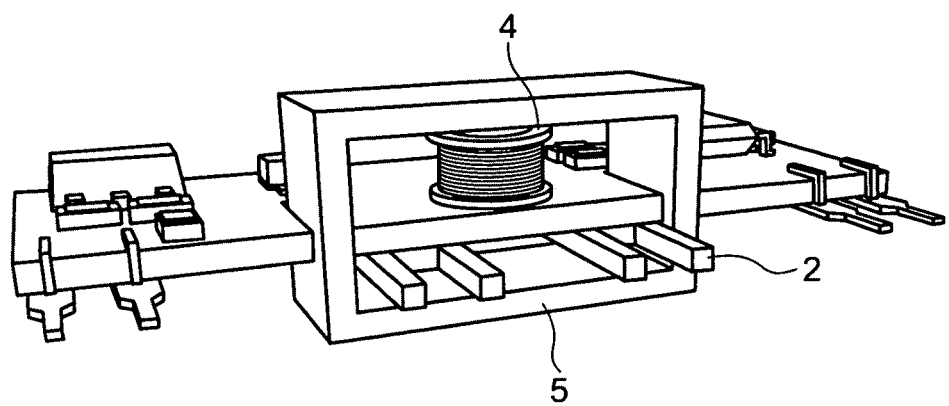
FIG. 5 is an illustration showing the configuration and an assembled state of the current sensor according to the first exemplary embodiment.

As shown in FIG. 5, the substrate 1 is provided with the annular shaped magnetic core 5 having rectangular end surfaces. This means that the magnetic core 5 is configured such that a belt-like body of a constant width is formed to be in an annular shape with rectangular side faces. In other words, the magnetic core 5 is formed in a cylindrical shape, and the width direction of the belt-like body is formed corresponding to the height direction (length direction) of the cylindrical body. The magnetic core 5 may be formed of a soft magnetic body, for example.

As shown in FIG. 5, the magnetic core 5 can be provided to the substrate 1 such that a pair of walls (walls 53 and 54 in FIG. 8) facing each other, constituting the shorter sides of the magnetic core 5 in this case, are inserted into the notches 11 and 12 of the substrate 1 in a state where the walls are positioned perpendicular to the substrate 1. In other words, the walls of the shorter sides linking a pair of walls (walls 51 and 52 in FIG. 8) constituting the longer sides are inserted into the notches 11 and 12 respectively, from the end face side of the magnetic core 5. As such, the pair of walls (walls 51 and 52 in FIG. 8) of the longer sides of the magnetic core 5 are positioned in parallel with the substrate 1. In other words, the pair of walls 51 and 52 of the longer sides are positioned in parallel with the plane formed by the current bar 2. Further, the inner surfaces of the pair of walls 51 and 52 of the longer sides are formed to be flat. Similarly, the inner surfaces of the pair of walls 53 and 54 of the shorter sides are also formed to be flat.

It should be noted that the pair of walls 53 and 54 of the shorter sides of the magnetic core 5, which are perpendicular to the substrate 1, may be formed of a pair of curved walls having almost the same curvature positioned outside the walls 53 and 54. Further, portions where the respective walls are linked, that is, portions where the respective walls are orthogonally linked, may be formed such that the walls are linked smoothly without being linked orthogonally, so that the walls are linked to be curved, that is, linked to be in a circular shape with a predetermined radius. With the above-described structure, there is a possibility of reducing local generation of a magnetic field.

Referring to FIG. 8 showing the schematic configuration of the current sensor, the magnetic core 5 is arranged so as to surround the current bar 2, the magnetic sensor 3, and the coil 4 mounted on the substrate 1, as described above. Thereby, the current bar 2, the magnetic sensor 3, and the coil 4 are arranged to be interposed between the pair of walls 51 and 52 of the longer sides of the magnetic core 5.

Next, functions of the magnetic core 5 will be described with reference to FIGS. 9 to 11. First, when electric current flows in the current bar 2, a magnetic field is generated around the current bar 2. In this example, when electric current flows in the current bar 2 as shown in FIG. 9, magnetic fields are generated as shown by the arrows if dashed lines around the linear portions 21 and 22 of the current bar 2. Then, the magnetic fields are intensified by the magnetic core 5 located around the current bar 2, and at the center between the parallel linear portions 21 and 22 of the current bar 2, a magnetic field is generated in a direction perpendicular to the plane formed by the current bar 2. As such, the magnetic field is in an intensified state compared with the case without the magnetic core 5. Then, as shown in FIG. 9, as the magnetic sensor 3 is disposed between the linear portions 21 and 22 of the current bar 2, the magnetic field can be detected by the magnetic sensor 3.

As the coil 4 is also disposed at the center between the linear portions 21 and 22 of the current bar 2, a magnetic field which offsets the magnetic field perpendicular to the substrate 1 generated by the current bar 2, can be generated. At this time, the controller 10 measures the detection value from the magnetic sensor 3, and controls the value of the electric current to flow in the coil 4, to be "0". For example, if the magnetic sensor 3 detects a magnetic field of a predetermined value, the controller 10 controls so as to flow electric current in which the magnitude thereof corresponds to this value and in a direction of generating a magnetic field of the opposite direction. This means that as the value of the magnetic field detected by the magnetic sensor 3 is larger, electric current having a larger value will flow in the coil 4. At this time, a value in proportion to the value of the electric current flowing in the coil 4 becomes the value of the electric current flowing in the current bar 2. As such, the controller 10 outputs a value obtained by applying predetermined operation to the value of the electric current flowing in the coil 4 as a value of the electric current flowing in the current bar 2.

Figure 1A:
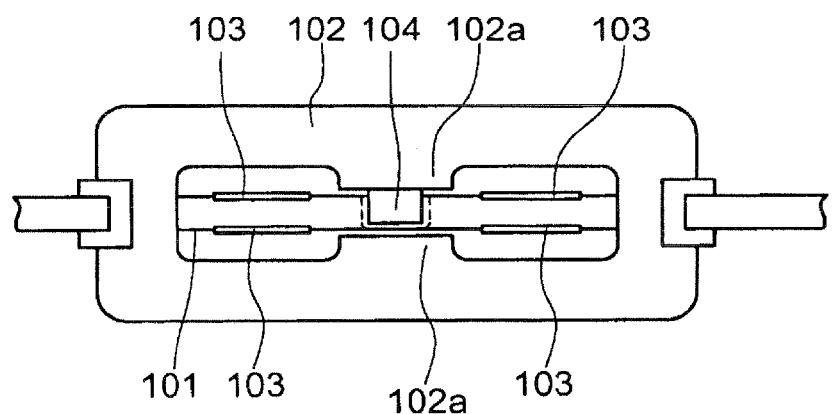
FIG. 1A is a diagram showing the configuration of a current sensor related to the present invention.
Figure 1B:
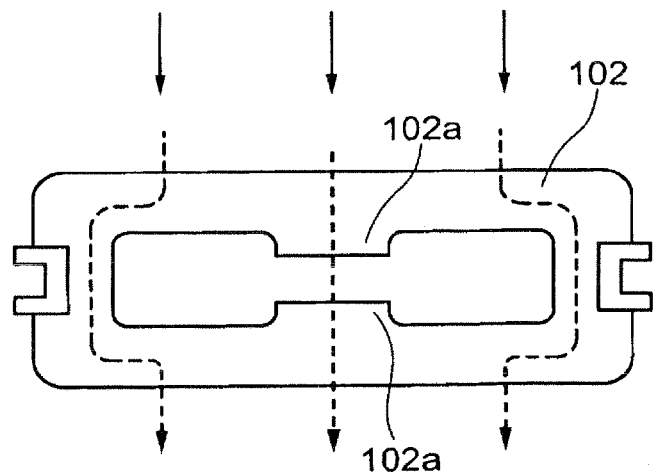
FIG. 1B is a diagram showing the operation of the current sensor related to the present invention.

Further, the magnetic core 5 also has a function of blocking an outside magnetic field so as to prevent the outside magnetic filed from being detected by the magnetic sensor 3, in addition to the function of intensifying the magnetic field generated by the electric current flowing in the current bar 2 as described above. In an assumption that an outside magnet field is generated in a direction perpendicular to the substrate 1, that is, in a direction perpendicular to the plane formed by the current bar 2, as shown by the arrows of solid lines in FIG. 10, although the outside magnetic field travels through the magnetic core 5 itself as shown by the arrows of dashed lines, the intensity thereof is reduced in the inner space where the magnetic sensor 3 is disposed. In particular, as the pair of walls 51 and 52 on the longer sides of the magnetic core 5 in this exemplary embodiment are formed to be flat, the distance between the pair of walls 51 and 52 are constant. As such, in the core 102 where the protruding portions 102a described in FIG. 1B are formed, although the outside magnetic field is intensified so that the magnetic field having an intensity detectable by the magnetic sensor may pass between the protruding portions 102a, in the magnetic core 5 of the present invention, the intensity of the outside magnetic field passing through the inside can be significantly reduced so that the outside magnetic field is blocked. Consequently, it is possible to prevent the outside magnetic field from being detected by the magnetic sensor 3.

The magnetic shielding effect of the magnetic core is the same with respect to the outside magnetic field in a direction parallel to the substrate 1, shown by the arrows of solid lines in FIG. 11. Although the outside magnetic field travels through the magnetic core 5 itself as shown by the arrows of dashed lines, the intensity thereof is significantly reduced within the inner space where the magnetic sensor 3 is disposed, so that the external magnetic field can be blocked.

Figure 6:
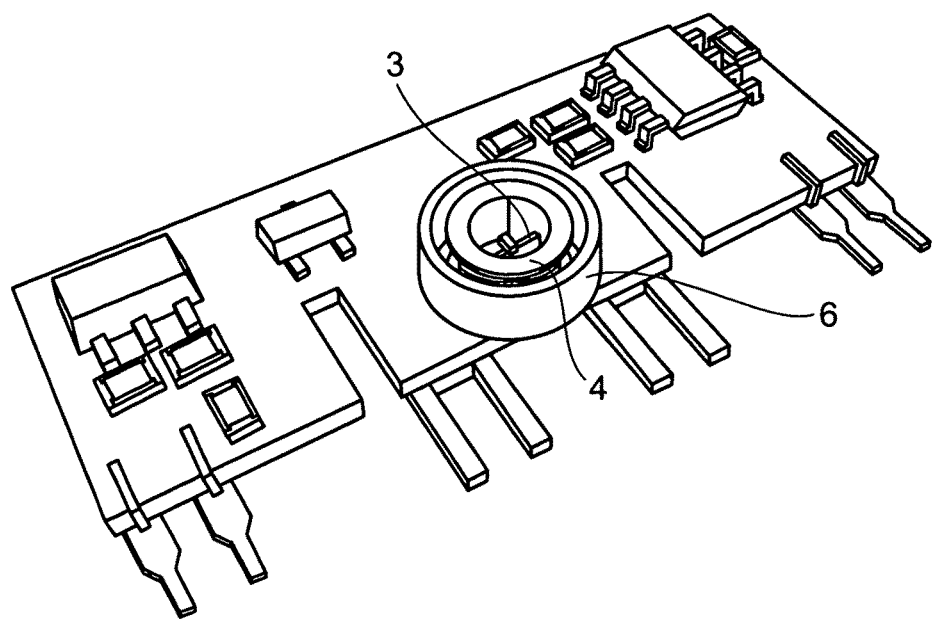
FIG. 6 is an illustration showing the configuration and an assembled state of the current sensor according to the first exemplary embodiment.

Before mounting the magnetic core 5 on the substrate 1, a shield 6, which is a soft magnetic body in a cylindrical shape slightly larger than the coil 4 and has an open end surface which is parallel to the substrate 1 and to be disposed on the substrate 1, is mounted on the substrate 1 so as to surround the coil 4 and the magnetic sensor 3 positioned thereinside, as shown in FIG. 6. Then, the magnetic core 5 is disposed so as to surround the shied 6 as well.

Figure 7:
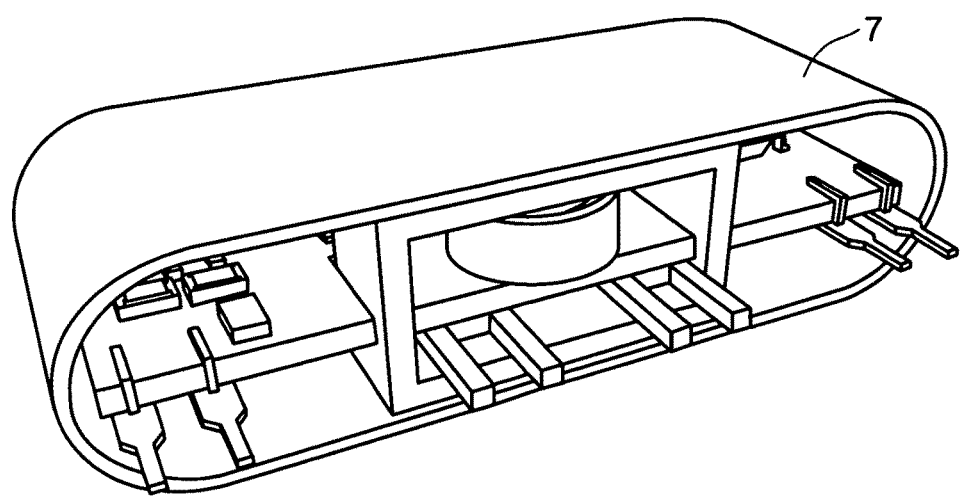
FIG. 7 is an illustration showing the configuration and an assembled state of the current sensor according to the first exemplary embodiment.
Figure 8:
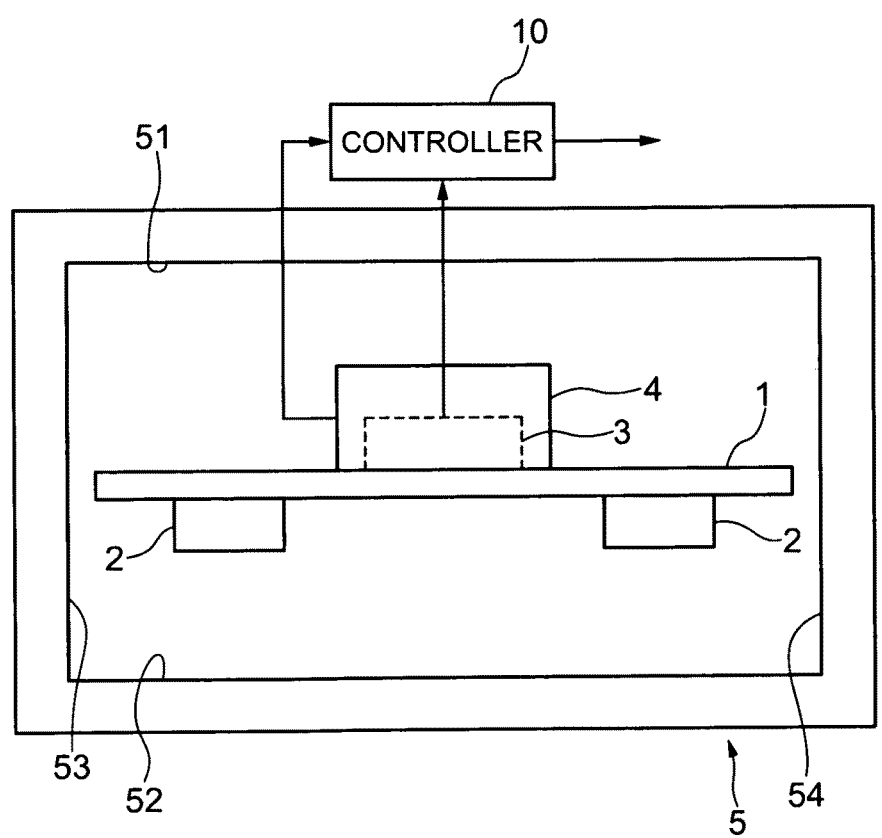
FIG. 8 is a diagram showing the configuration of the current sensor according to the first exemplary embodiment of the present invention.

Then, as shown in FIG. 7, the entire configuration mounted on the substrate 1 as described above is surrounded by the case 7, whereby the current sensor is configured. It should be noted that the case 7 may be formed of flame-retardant material, and inside of the case 7 is sealed with a rubber or resin mold.

Next, a detailed configuration of the magnetic sensor 3 of this exemplary embodiment will be described with reference to FIGS. 12 to 18. First, the magnetic sensor 3 of this exemplary embodiment includes a GMR chip 31 mounted on the substrate 1, and a magnetic body 21 arranged on the upper surface of the GMR chip 31.

Figure 12:
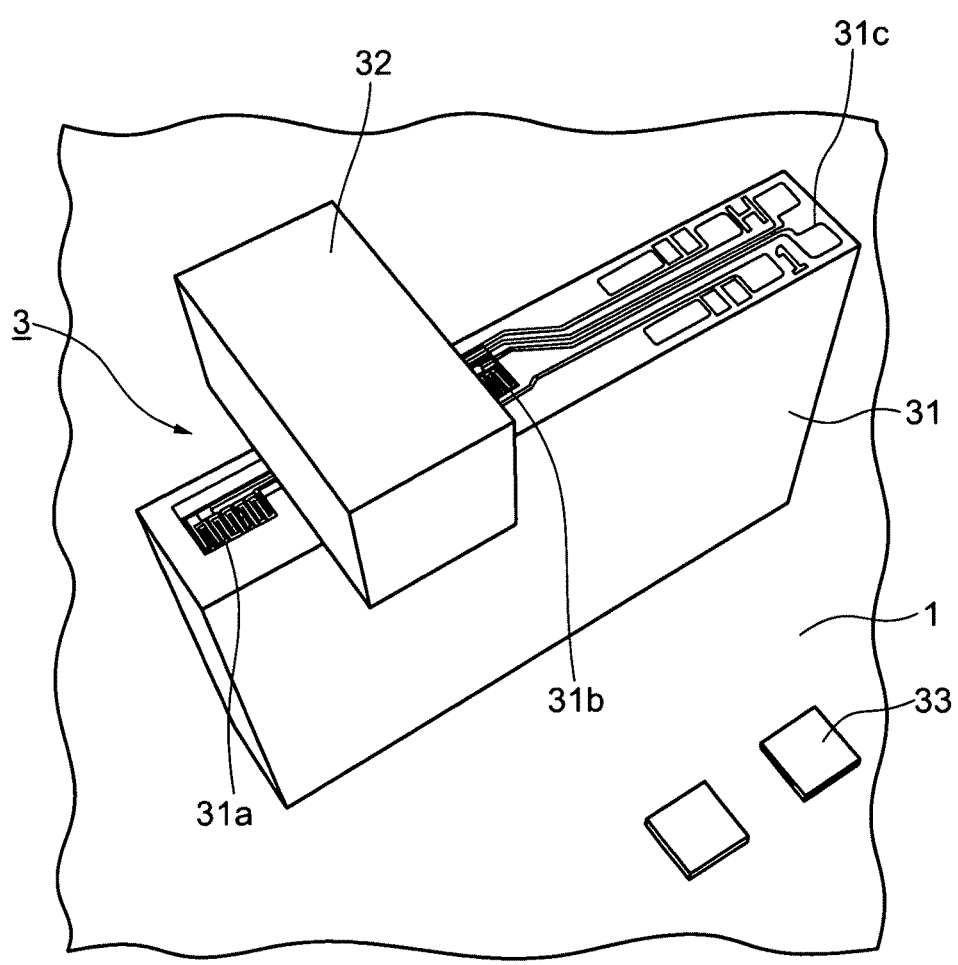
FIG. 12 is an illustration showing the configuration of the magnetic sensor disclosed in FIG. 1.
Figure 15:
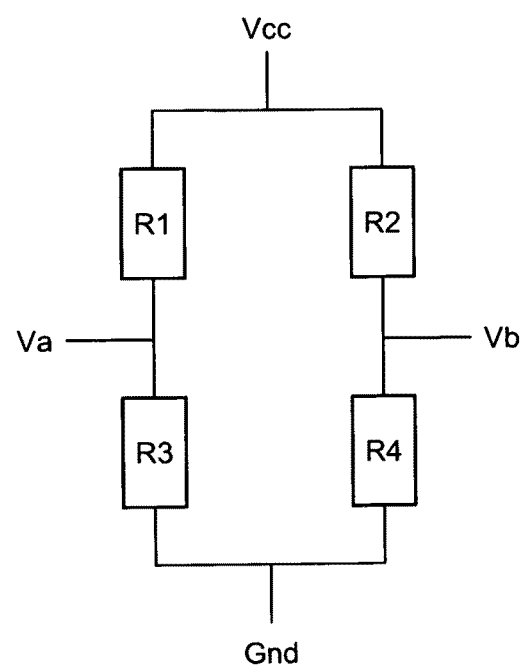
FIG. 15 is a diagram showing a bridge circuit configured of GMR elements formed on the GMR chip disclosed in FIG. 12.

Specifically, as shown in FIG. 12, the GMR chip 31 is in an almost rectangular parallelepiped shape, and has an element surface on which four GMR elements R1, R2, R3, and R4 are formed, on an upper surface opposite to the bottom surface contacting the substrate 1. These GMR elements R1, R2, R3, and R4 are connected with each other as shown in FIG. 15 to thereby constitute a bridge circuit. The GMR elements R1 and R3 and the GMR elements R2 and R4 are respectively connected in series, and the series-connected GMR elements R1 and R3 and the series-connected GMR elements R2 and R4 are connected in parallel with respect to the power source to thereby constitute a closed circuit. This configuration enables to detect a differential voltage between a connecting point Va between the GMR elements R1 and R3 and a connecting point Vb between the GMR elements R2 and R4. It is assumed that the bridge circuit has been formed on the GMR chip 31 such that a differential voltage can be detected as described above.

Figure 13:
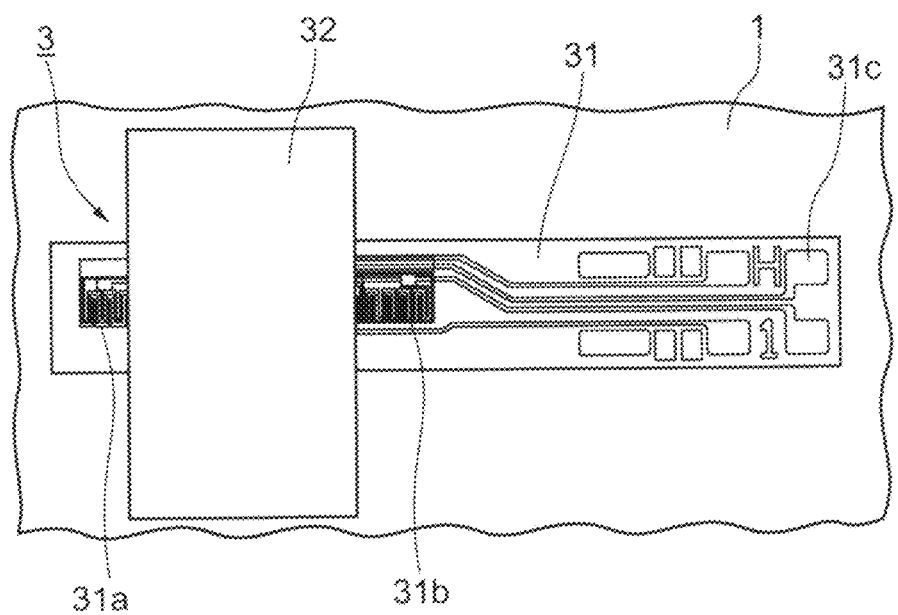
FIG. 13 is a top view of the magnetic sensor disclosed in FIG. 12.

In the present embodiment, as shown in FIG. 13, a pair of GMR elements R1 and R4, which are not adjacently-connected with each other in the bridge circuit shown in FIG. 15 among the four GMR elements, are formed in almost the same area in an element forming region 31a. Similarly, another pair of GMR elements R2 and R3, which are not adjacently-connected with each other in the bridge circuit, are formed in almost the same area in an element forming region 31b.

Figure 14:
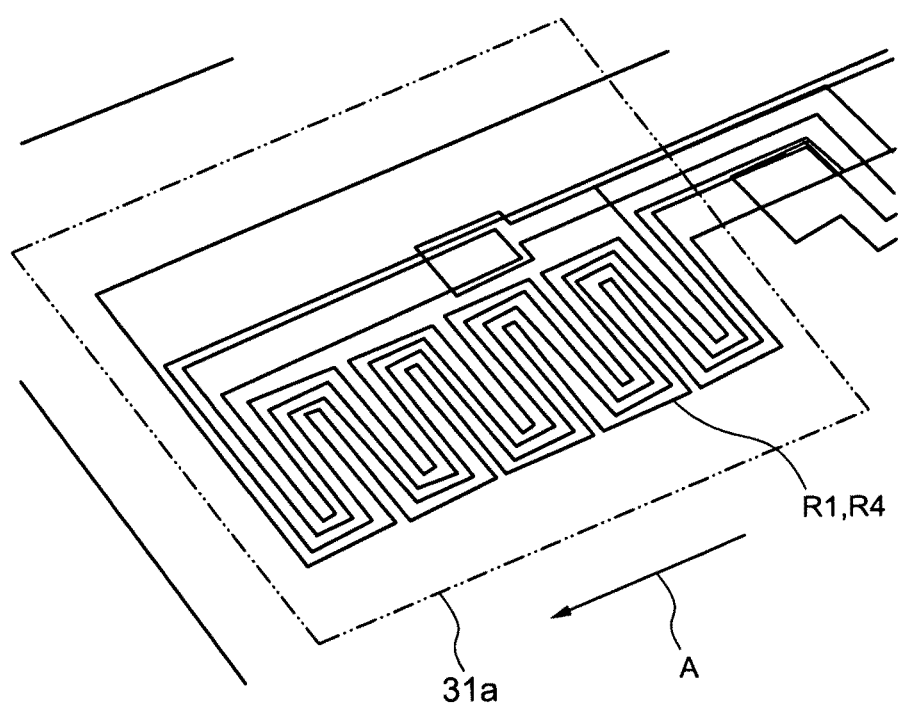
FIG. 14 is an enlarged view of a part of the GMR chip disclosed in FIG. 12.

Referring to FIG. 14 showing an enlarged view of the element forming region 31a, the two GMR elements R1 and R4 are formed in a meander shape (zigzag) in the almost same area. Similarly, the two GMR elements R2 and R3 in the element forming region 31b are also formed in a meander shape in the almost same area. Further, all GMR elements R1, R2, R3, and R4 are fixedly magnetized in the same direction, that is, the arrow A direction.

The respective element forming regions 31a and 31b, in which the pairs of GMR elements (R1 and R4, and R2 and R3) are formed, are distant from each other. For example, as shown in FIG. 13, the respective element forming regions 31a and 31b are formed near one end and near the center in a long side direction of the GMR chip 31, that is, in the fixed magnetization direction of the GMR elements. The respective element forming regions 31a and 31b are formed with a space between them where a magnetic body 32, which will be described later, can be disposed.

Now, the characteristics of each of the GMR elements used in the present invention will be described with reference to FIG. 16. The GMR element is a spin-valve type GMR element (Giant Magneto Resistive effect element) in which a resistance value to be output varies according to the direction of a magnetic field to be input. FIG. 16 shows a relationship between an entering angle of a magnetic field H relative to the GMR element and a resistance value.

Figure 16A:
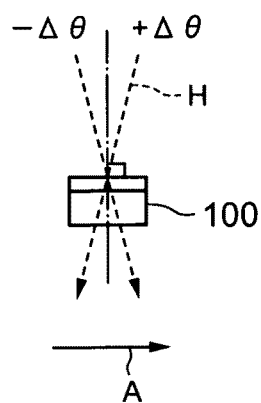
FIG. 16A is an illustration for explaining the characteristics of the GMR element.

In the example shown in FIG. 16A, the GMR chip 31 is configured such that GMR elements are formed on the upper surface thereof. It is assumed that these GMR elements are fixedly magnetized in a direction of an arrow A so as to be able to detect a magnetic field in the arrow A direction.

Figure 16B:
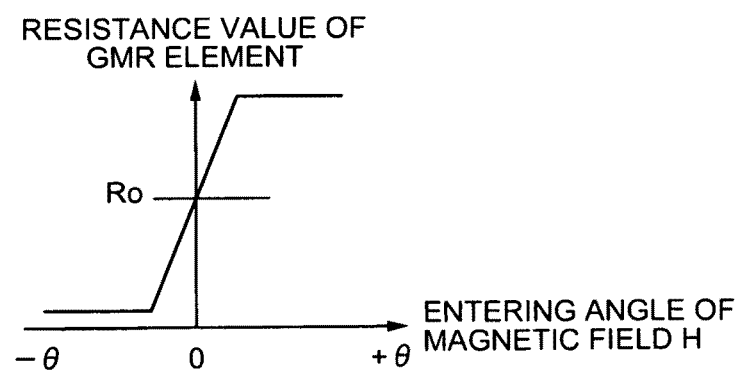
FIG. 16B is an illustration for explaining the characteristics of the GMR element.

In FIG. 16A, each GMR element is arranged in the magnetic field H which perpendicularly enters the surface of the chip on which the GMR element is formed. In this case, a resistance value of the GMR element is "Ro", as shown in FIG. 16B. On the other hand, when the direction of the magnetic field inclines, the entering angle of the magnetic field H relative to the surface on which the GMR element is formed inclines from the perpendicular direction by an angle of $-\Delta\theta$ ($\Delta$(delta): used for representing the amount of change) or $+\Delta\theta$, as shown by the dashed lines in FIG. 16A. As the GMR element is fixedly magnetized in one direction as described above, the direction of the magnetic field is changed in that direction, whereby the GMR resistance value varies as shown in FIG. 16B. In this way, the GMR element has a characteristic that when the resistance value is set to be Ro in a state where the entering direction of the magnetic field is perpendicular, the resistance value significantly varies particularly when the direction of the magnetic field H inclines by a minute angle.

Figure 17:
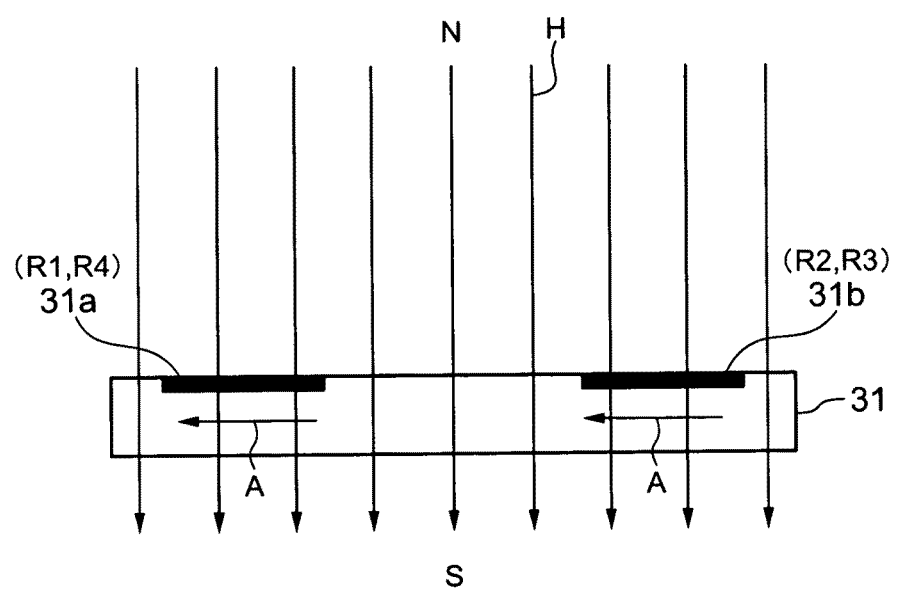
FIG. 17 is an illustration showing a state of a magnetic field with respect to the GMR chip.

FIG. 17 is a view showing the GMR chip 31 seen from a side, illustrating a state where the GMR chip 31 is arranged in the magnetic field H. It should be noted that FIG. 17 does not include the magnetic body 32. As shown in FIG. 17, when the direction of the magnetic field H is changed from a perpendicular direction relative to the fixed magnetization direction A of the GMR elements R1, R2, R3, and R4, the direction is changed by the almost same angle relative to all GMR elements R1, R2, R3, and R4. Consequently, resistance values of all GMR elements R1, R2, R3, and R4 vary by the almost same value. In this configuration, however, it is difficult to detect a differential voltage between the connecting points Va and Vb in the bridge circuit shown in FIG. 15 constituted of these GMR elements R1, R2, R3, and R4.

Meanwhile, the magnetic sensor 3 of the present invention includes the magnetic body 32 for changing the direction of the magnetic field H to be input to the GMR elements R1, R2, R3, and R4, in the vicinity of the bridge circuit formed on the GMR chip 31. Specifically, the magnetic sensor 3 of this exemplary embodiment has the magnetic body 32 disposed between the respective element forming regions 31a and 31b of the bridge circuit formed on the GMR chip 31. It should be noted that the magnetic body 32 is made of soft ferrite (soft magnetic material), for example. As described above, the magnetic body 32 and the GMR elements R1, R2, R3, and R4 are arranged on the same straight line along the fixed magnetization direction A of the GMR elements. It should be noted that the arranging position of the magnetic body 32 is not limited to this position. For example, the magnetic body 32 may be disposed not on the GMR chip 31 but above the GMR chip 31, and is not necessarily disposed between the respective element forming regions 31a and 31b.

Figure 18:
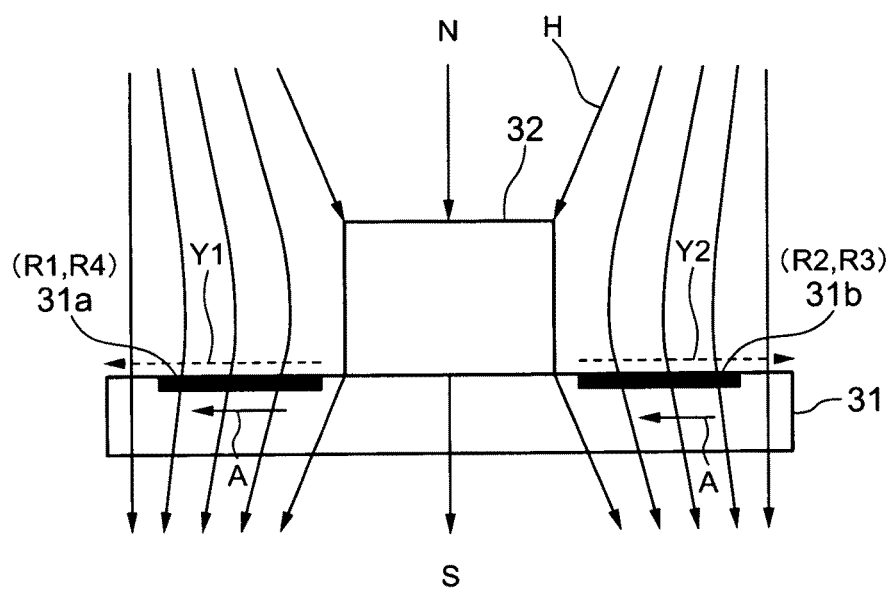
FIG. 18 is an illustration showing a state of the magnetic field with respect to the magnetic sensor of the first exemplary embodiment.

Next, operation of the magnetic sensor 3 having the above-described configuration will be described with reference to FIG. 18. FIG. 18 shows a case where the magnetic sensor 3 is arranged in the magnetic field H, the direction of which is almost perpendicular to the surface on which the GMR elements R1, R2, R3, and R4 are formed, similar to the example shown in FIG. 17. In this exemplary embodiment, the magnetic field H is drawn to the magnetic body 32 in the part from above the magnetic body 32 to almost the center of the magnetic body 32, and the magnetic field H is bent in a direction away from the magnetic body 32 in the part from almost the center of the magnetic body 32 to the lower part of the magnetic body 32 where the respective element forming regions 31a and 31b are formed, as shown in FIG. 18.

As such, the magnetic fields H in opposite directions enter the respective element forming region 31a and 31b (GMR elements R1 and R4 and GMR elements R2 and R3) located over the magnetic body 32. Specifically, as shown by the arrows Y1 and Y2 of dashed lines in FIG. 18, the magnetic field H in which the direction thereof is changed to the same direction as the fixed magnetization direction A enters the GMR elements R1 and R4 in the element forming region 31a, and the magnetic field H in which the direction thereof is changed to a direction opposite to the fixed magnetization direction A enters the GMR elements R2 and R3 in the element forming region 31b. It should be noted that in order to allow the magnetic field H to easily enter the GMR elements, another magnetic body may be arranged on the bottom surface of the GMR chip 31, that is, between the GMR chip 31 and the substrate 1.

When the magnetic field enters the respective GMR elements as described above, in the bridge circuit, resistance values of the GMR elements R1 and R4 and resistance values of the GMR elements R2 and R3 vary into opposite symbols, respectively. For example, the resistance values of the GMR elements R1 and R4 vary by $+\Delta R$, and the resistance values of the GMR elements R2 and R3 vary by $-\Delta R$. Thereby, the differential voltage between the connecting points Va and Vb becomes larger, so that a large differential voltage value can be detected. It should be noted that a circuit which detects a differential voltage may be the controller 10 described by referring to FIG. 8, and is formed on the substrate 1. As such, as shown in FIG. 12, by connecting the terminal 31c formed on the element forming surface of the GMR chip 31 and the terminal 33 formed on the substrate 1, the differential voltage can be detected by the controller 10 on the substrate 1.

Then, the controller 10 controls electric current to be flown in the coil 4 so as to generate, in the coil 4, a magnetic field of the opposite direction which offsets the generated magnetic field, according to the value of the operating voltage detected from the bridge circuit of the GMR chip 31. Then, the controller 10 detects the value of the electric current flowing in the current bar 2, based on the value of the electric current flown in the coil 4, and outputs the value to the outside.

As described above, as the configuration of the magnetic core 5 is simple in the current sensor of this exemplary embodiment, the current sensor can be manufactured at low cost, and is capable of preventing erroneous direction of external magnetic noise, and is highly accurate.

Further, by using the magnetic sensor 3 of the above-described configuration, accuracy of detecting the magnetic field can be improved. In particular, in this exemplary embodiment, as the magnetic sensor 3 is constituted of the GMR elements (magneto resistive effect elements) arranged such that the fixed magnetization directions thereof are in the same direction, the bridge circuit formed by connecting the GMR elements can be formed on a single chip, whereby variations in resistance values of the respective GMR elements can be suppressed. As a result, accuracy of detecting the magnetic field can be further improved by suppressing an offset voltage in the bridge circuit. In addition, as the GMR elements constituting the bridge circuit are formed not on a plurality of divided chips but on a single chip, the size of the chip can be reduced as a whole. Thereby, the manufacturing efficiency of the chip is also improved, leading to reduction in the sensor costs.

<Second Exemplary Embodiment

Figure 19:
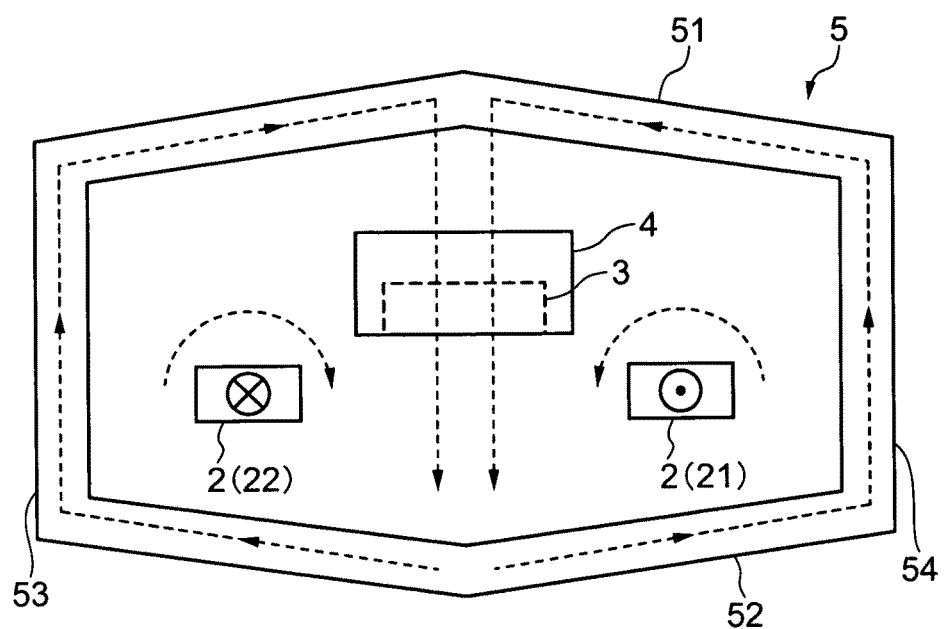
FIG. 19 is an illustration for explaining the configuration and functions of a magnetic core according to a second exemplary embodiment.
Figure 20:
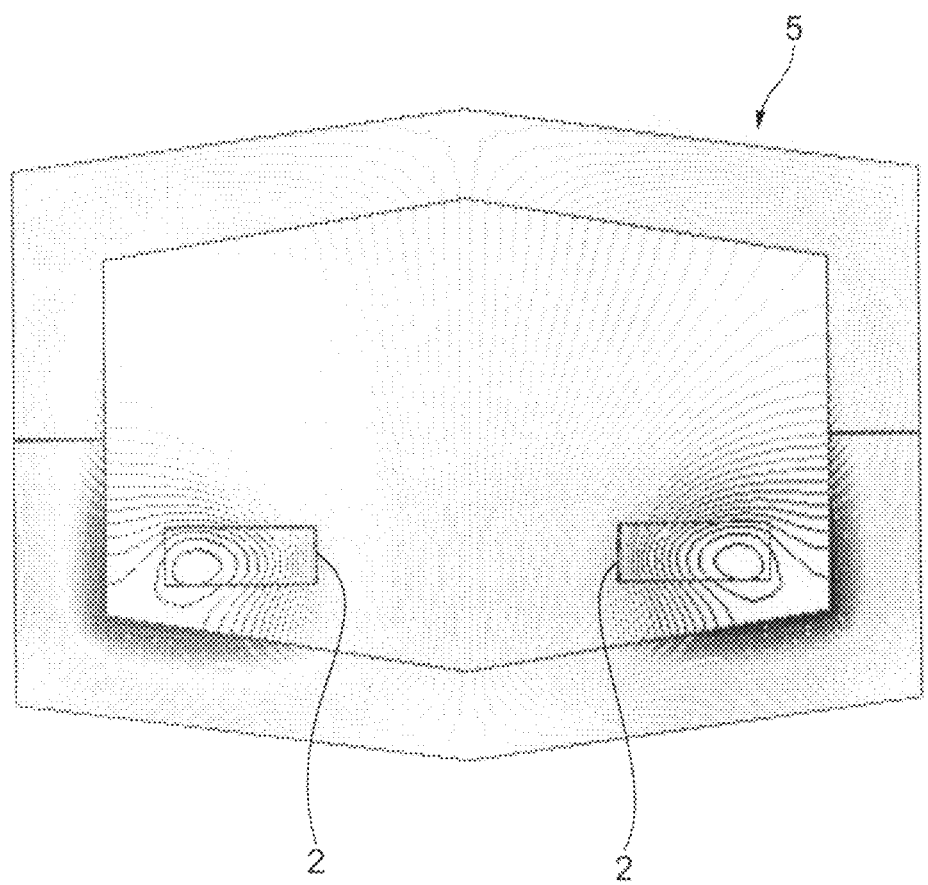
FIG. 20 is an illustration showing a state of a magnetic field generated inside the magnetic core according to the second exemplary embodiment.

Next, a second exemplary embodiment of the present invention will be described with reference to FIGS. 19 and 20. FIG. 19 shows the schematic configuration of a current sensor of this exemplary embodiment, and FIG. 20 shows a state of a magnetic field.

The current sensor of this exemplary embodiment is different from that of the first exemplary embodiment in the shape of the magnetic core 5. Specifically, as shown in FIG. 19, the magnetic core 5 of this exemplary embodiment is configured such that the end surface is in a annular shape but a pair of walls 51 and 52 facing the substrate 1 are formed to be away from each other at the center parts thereof. This means that each of the walls 51 and 52, constituting a pair of walls 51 and 52 on the long sides, is formed to be bent at a predetermined angle into a mount at the center, and each of the dented portions formed by the bent faces inside the magnetic core 5 itself to thereby face each other. As the bent portions of the respective walls are located at the center, the distance between the pair of walls 51 and 52 is the farthest in the center portions. Further, the center part of the pair of walls 51 and 52 are located at the center between the respective linear portions 21 and 22 of the current bar 2, where the magnetic sensor 3 and the coil 4 are to be arranged.

Now, a case where electric current flows in the current bar 2 of a current sensor with the magnetic core 5 of the above-described shape, as shown in FIG. 19, will be considered. A magnetic field is generated around the linear portions 21 and 22 of the current bar 2 as shown by the arrows of dashed lines, and the generated magnetic field is intensified by the magnetic core 5 located around the current bar 2, and at the center between the respective linear portions 21 and 22, which are in parallel with each other, of the current bar 2, another magnetic field is generated in a direction perpendicular to the plane formed by the current bar 2, resulting in a state where the magnet field is intensified compared with the case where no magnetic core 5 is provided. FIG. 20 is an illustration simulating the direction of the magnetic field to be generated when electric current flows in the current bar 2. As described above, as an intensified magnetic field is generated in a direction perpendicular to the substrate 1 at the center of the magnetic core 5, the magnetic field can be detected by the magnetic sensor 3 arranged at the center between the linear portions 21 and 22 of the current bar 2.

Further, in the magnetic core 5 having the above-described shape, the pair of walls 51 and 52 facing each other are configured such that the distance between them in the position between the linear portions 21 and 22 of the current bar 2, that is, the distance between them at the center between the linear portions 21 and 22, is longer than that in the position where the linear portions 21 and 22 locate. As such, even if an external magnetic field is generated in a direction perpendicular to the plane formed by the linear portions 21 and 22 of the current bar 2, as the intensity thereof is reduced in the center part where the magnetic sensor 3 locates, the magnetism can be blocked effectively. As a result, it is possible to prevent false detection of external magnetic noise by the magnetic sensor 3.

It should be noted that the shape of the magnetic core 5 is not limited to the above-described shape. For example, the pair of walls 51 and 52 of the magnetic core 5 may be formed to be bent in a curved shape so as to expand in the center part. In any case, including the case of the first exemplary embodiment, it is preferable that the distance between the pair of walls 51 and 52 of the magnetic core 5 does not become shorter in the part where the magnetic core 3 is arranged, compared with other parts. As such, in the part where the magnetic sensor 3 locates, external magnetic field can be reduced by the magnetic core 5 so that the external magnetic core can be blocked effectively, and the magnetic field generated by electric current flowing in the current bar 2 can be intensified.

<Third Exemplary Embodiment>

Figure 21:
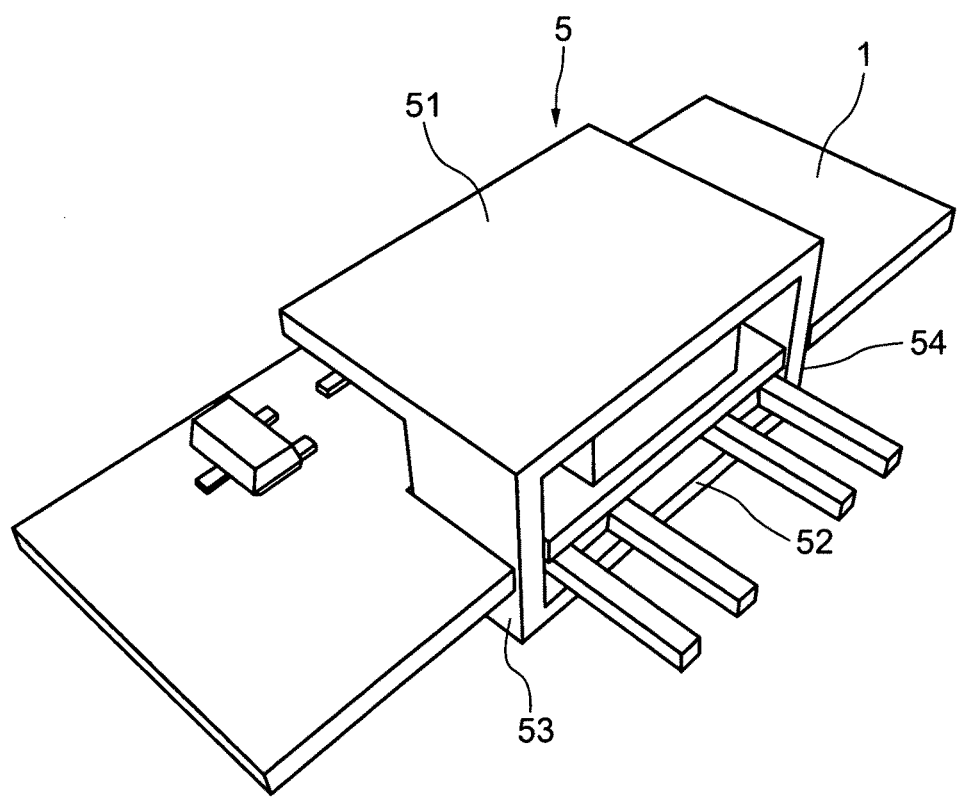
FIG. 21 is an illustration showing the configuration of a magnetic core according to a third exemplary embodiment.

A third exemplary embodiment of the present invention will be described with reference to FIG. 21. FIG. 21 shows the configuration of a current sensor of this exemplary embodiment, and in particular, another configuration of a magnetic core.

As shown in FIG. 21, the magnetic core 5 of this exemplary embodiment is configured to be in a cylindrical shape with the end faces being rectangle, which is the same as the one of the first exemplary embodiment. In this exemplary embodiment, a pair of walls 51 and 52 on the long sides of the magnetic core 5, which are parallel to the substrate 1 and face the substrate 1, are formed to be larger, in particular. As such, although the magnetic core 5 of the first exemplary embodiment is configured such that the width of the respective walls corresponding to the height direction (length) of the cylindrical body is the same, in this exemplary embodiment, the width of the pair of walls 51 and 52 on the long sides is formed to be larger than the width of a pair of walls 53 and 54 on the short sides linking the pair of walls 51 and 52 of the long sides. Although FIG. 21 only shows the wall 51 located on the top surface side of the substrate 1, the wall 52 located on the back surface side of the substrate 1 is also formed to have a larger width than that of the walls 53 and 54 on the short sides, similar to the wall 51.

By forming the magnetic core 5 to be in the shape as described above, it is possible to cover a larger area in the direction perpendicular to the substrate 1 which is a direction where the magnetic field is detectable in the magnetic sensor 3. Accordingly, an influence of external magnetic field noise on the magnetic sensor 3 can be further reduced.

<Fourth Exemplary Embodiment>

Figure 22:
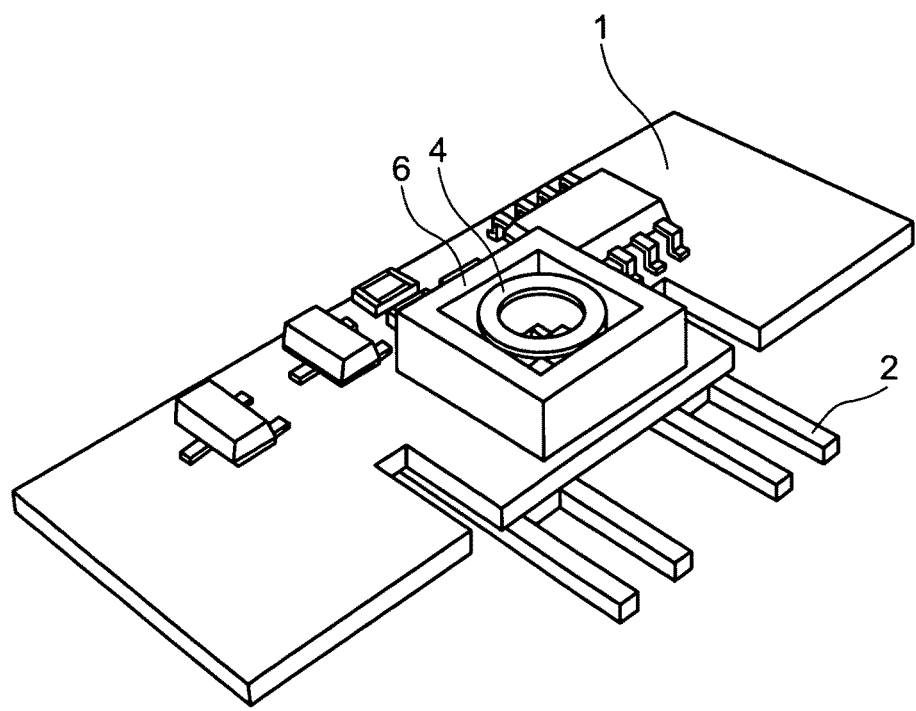
FIG. 22 is an illustration showing the configuration of a shield according to a fourth exemplary embodiment.

Next, a fourth exemplary embodiment of the present invention will be described with reference to FIG. 22. FIG. 22 shows the configuration of a current sensor of this exemplary embodiment, and in particular, another configuration of a shield.

As shown in FIG. 22, the shield 6 of this exemplary embodiment is formed to be in a cylindrical shape with the end faces being rectangle (in this example, square), which is different from that of the first exemplary embodiment. The shield 6 is formed such that the inside thereof is formed to be larger than the outer shape of the coil 4, similar to the first exemplary embodiment, and is capable of being mounted on the substrate 1 so as to surround the coil 4 and the magnetic sensor 3 located inside.

By using this shield 6, an external magnetic field with respect to the magnetic sensor 3 in a direction parallel to the substrate 1 can be blocked. It should be noted that the shield 6 may be a cylindrical body having end faces in any shape.

<Fifth Exemplary Embodiment>

Figure 23A:
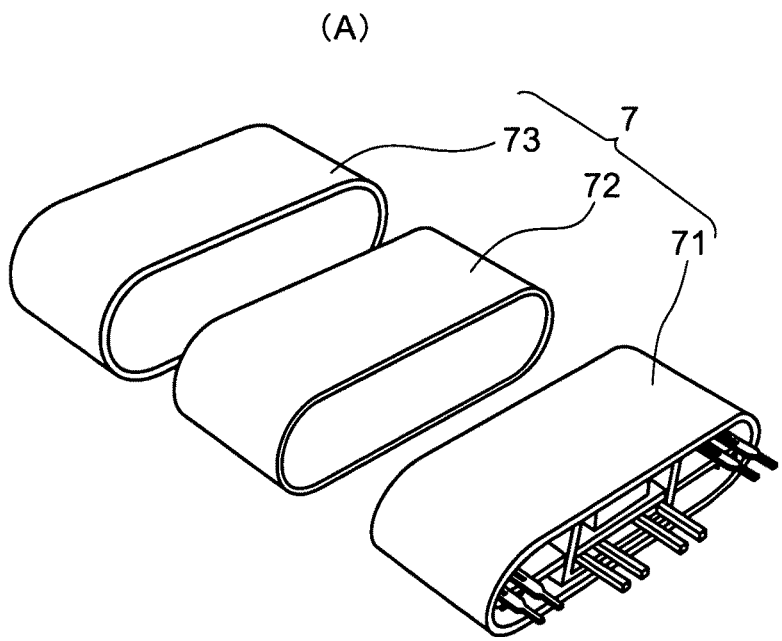
FIG. 23A is an illustration showing the configuration of a case according to a fifth exemplary embodiment.

Next, a fifth exemplary embodiment of the present invention will be described with reference to FIG. 23. FIG. 23 shows the configuration of a current sensor of this exemplary embodiment, and in particular, shows another configuration of a case. FIG. 23A is an exploded view of the case, and FIG. 23B shows a current sensor to which the assembled case is applied.

Figure 23B:
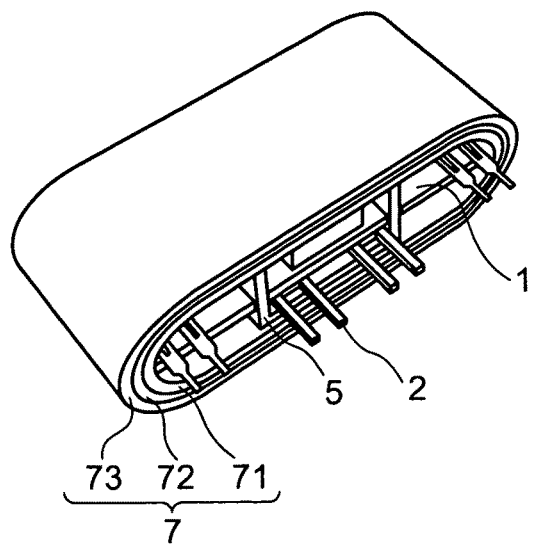
FIG. 23B is an illustration showing the configuration of the case according to the fifth exemplary embodiment.

As shown in FIGS. 23A and 23B, the case 7 surrounding the substrate 1, the magnetic sensor 3, and the like of this exemplary embodiment is formed in a three-layered structure, which is different from that of the first exemplary embodiment. Specifically, a layer 72 of a metallic material having high magnetic permeability such as soft iron or permalloy is provided between layers 71 and 73 of a frame-retardant material located inside and outside, forming a three-layered structure. Thereby, the case 7 also has a function of blocking external magnetic field, whereby accuracy of the current sensor can be further improved.

<Sixth Exemplary Embodiment>

A sixth exemplary embodiment of the present invention will be described with reference to FIGS. 24 to 27. This exemplary embodiment shows another exemplary configuration of the magnetic sensor 3 described above.

Figure 24:
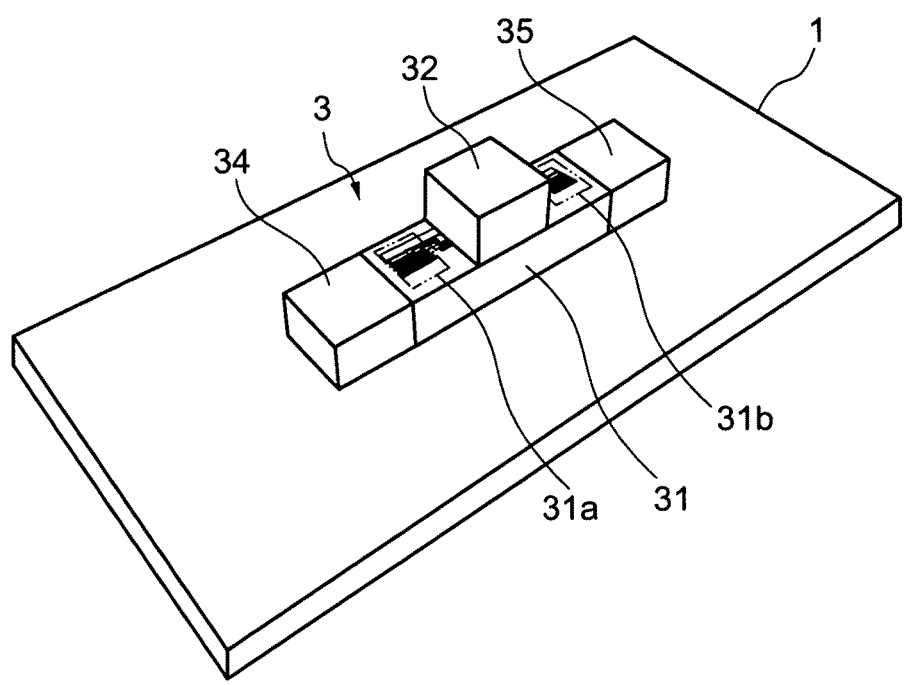
FIG. 24 is an illustration showing the configuration of a GMR sensor according to a sixth exemplary embodiment.

As shown in FIG. 24, the magnetic sensor 3 of this exemplary embodiment includes two other magnetic bodies 34 and 35 (e.g., soft ferrite (soft magnetic material)), in addition to the magnetic body 32 disposed on the GMR chip 31 in the first exemplary embodiment. Further, element forming regions 31a and 31b are formed on both ends of the GMR chip 31, which is different from the first exemplary embodiment. Accordingly, a terminal (terminal indicated by a reference numeral 31c in FIG. 12) connected to the bridge circuit formed in the GMR element is formed on an empty area of the element formation surface of the GMR chip 31.

Specifically, in the magnetic sensor 3 of this exemplary embodiment, the magnetic bodies 34 and 35 are arranged on the outside the respective element forming regions 31a and 31b of the GMR chip 31. In other words, the magnetic bodies 34 and 35 are respectively arranged at one end of the GMR chip 31 opposite to the element forming region 31b side, and at the other end of the GMR chip 31 opposite to the element forming region 31a side. Thereby, the magnetic bodies 34 and 35 are arranged below the surface on which the GMR elements R1, R2, R3, and R4 are formed in the respective element forming regions 31a and 31b.

Figure 25:
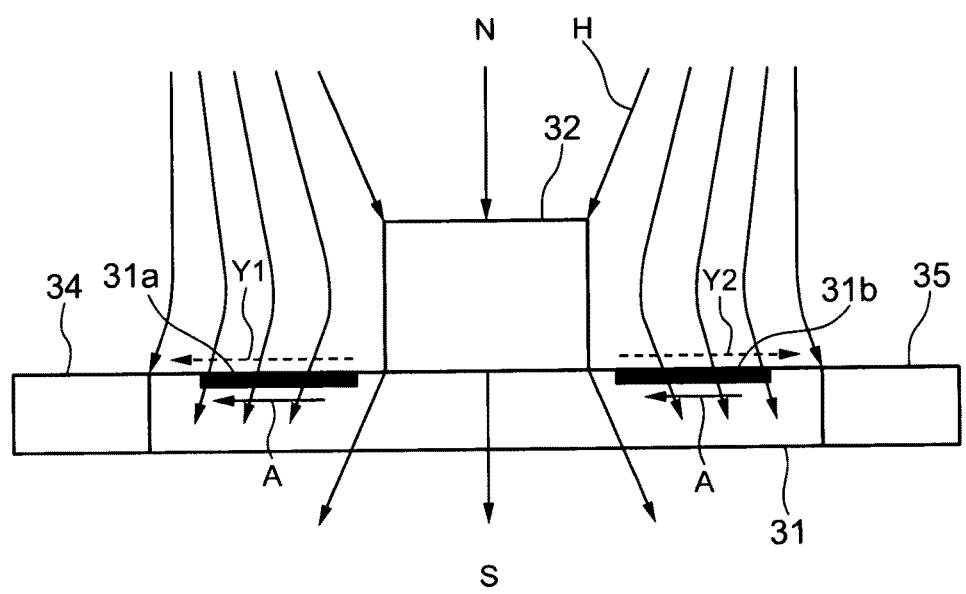
FIG. 25 is an illustration showing a state of a magnetic field with respect to the GMR sensor according to the sixth exemplary embodiment.

Next, operation of the magnetic sensor 3 of the above-described configuration will be described with reference to FIG. 25. FIG. 25 shows a case where the magnetic sensor 3 is arranged in the magnetic field H, the direction of which is almost perpendicular to the surface on which the GMR sensors R1, R2, R3, and R4 are formed, similar to the example of FIG. 18. In the part from almost the center of the magnetic body 32 to the lower part where the element forming regions 31a and 31b are formed, the magnetic field H is bent in a direction away from the magnetic body 32 in the same manner as described above, and drawn to the respective magnetic bodies 34 and 35 provided at the both ends of the GMR chip 31. Accordingly, compared with the first exemplary embodiment, the magnetic field H enters the respective element forming regions 31a and 31b (GMR elements (R1 and R4, and R2 and R3)) at greater angles in opposite directions. Specifically, as shown by the arrows Y1 and Y2 of dashed lines in FIG. 25, the magnetic field H in which the direction is changed to the same direction as the fixed magnetization direction A enters the GMR elements R1 and R4 on the element forming region 31a, and the magnetic field H in which the direction is changed to the opposite direction to the fixed magnetization direction A enters the GMR elements R2 and R3 on the element forming region 31b.

Then, in the bridge circuit, resistance values of the GMR elements R1 and R4 and resistance values of the GMR elements R2 and R3 vary into opposite symbols. Thereby, a difference between the connecting points Va and Vb which are the points of detecting a differential voltage becomes larger, so that a large differential voltage value can be detected.

Figure 26:
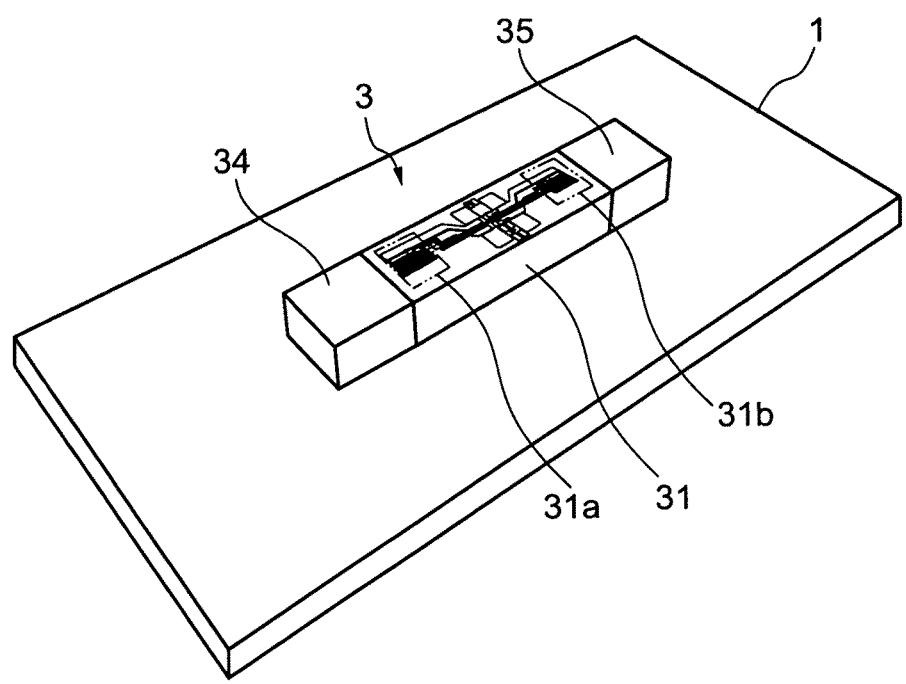
FIG. 26 is an illustration showing another configuration of a GMR sensor according to the sixth exemplary embodiment.

It should be noted that, as shown in FIG. 26, the magnetic sensor 3 may be configured such that the magnetic body 32 is not provided but the magnetic bodies 34 and 35 (e.g., soft ferrite (soft magnetic body)) are respectively provided on both end sides of the GMR chip 31.

Figure 27:
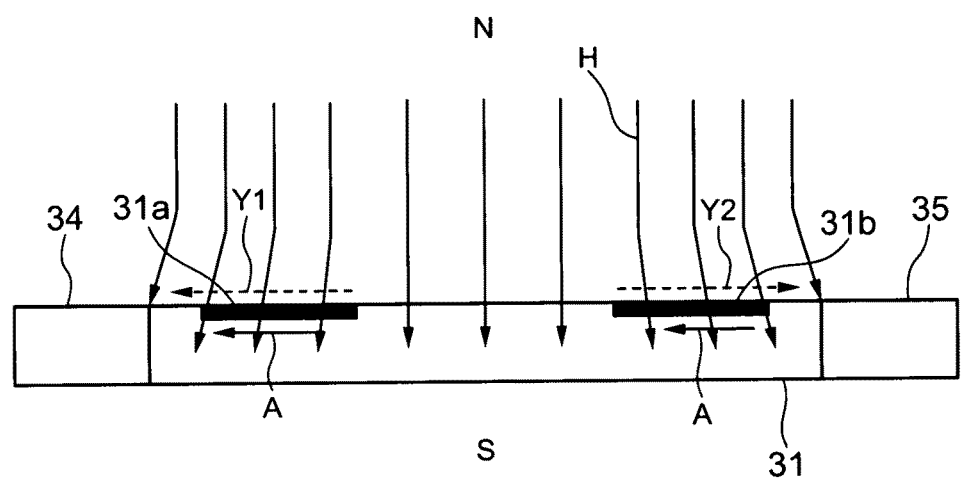
FIG. 27 is an illustration showing a state of a magnetic field with respect to the GMR sensor of the other configuration according to the sixth exemplary embodiment.

In this configuration, in the portions where the element forming regions 31a and 31b are formed, the direction of the magnetic field H is changed so as to be drawn to the respective magnetic bodies 34 and 35 formed at both ends of the GMR chip 31, as shown in FIG. 27. Accordingly, the magnetic field H enters the respective element forming regions 31a and 31b (GMR elements (R1 and R4, and R2 and R3)) at angles in opposite directions. More specifically, as shown by the arrows Y1 and Y2 of dashed lines in FIG. 27, the magnetic field H in which the direction is changed to the same direction as the fixed magnetization direction A enters the GMR elements R1 and R4 in the element forming region 31a, and the magnetic field H in which the direction is changed to the opposite direction to the fixed magnetization direction A enters the GMR elements R2 and R3 in the element forming region 31b.

With this configuration, resistance values of the GMR elements R1 and R4 and resistance values of the GMR elements R2 and R3 vary into opposite symbols in the bridge circuit. Thereby, as a difference between connecting points Va and Vb which are points for detecting a differential voltage becomes larger, a large differential voltage value can be detected.

Next, a seventh exemplary embodiment of the present invention will be described. This exemplary embodiment describes the overview of a current sensor.

A current sensor according to this exemplary embodiment includes: a current-measured wiring including parallel wiring sections in which portions of a same wiring are arranged in parallel such that electric current to be measured flows therein in opposite directions each other; a magnetism detection unit which is arranged between parallel wirings located in the parallel wiring sections and detects a magnetic field in a direction perpendicular to a plane formed by the parallel wirings; a current detection unit which detects electric current flowing in the current-measured wiring, based on the magnetic field detected by the magnetism detection unit; and a magnetic core surrounding the parallel wiring sections so as to intensify the magnetic field generated around the parallel wirings located in the parallel wiring sections when electric current flows in the parallel wirings. The magnetic core has a pair of walls facing each other over a plane formed by the parallel wirings, in which a distance between the pair of walls in a part located between the parallel wirings is the same as or longer than a distance in other parts. Further, the magnetism detection unit is arranged between the pair of walls of the magnetic core.

In the above-described current sensor, the magnetic core may be formed such that a distance between the pair of walls in a part located at the center between the parallel wirings is the same as or longer than a distance in other parts. Further, the magnetic core is desirably formed such that respective inner surfaces of the pair of walls are flat and parallel to the plane formed by the parallel wirings.

According to this current sensor, when electric current flows in the current-measured wiring, electric current flows in opposite directions in the respective parallel wirings located in the parallel wiring sections. As such, a magnetic field is generated around the current-measured wiring, and in particular, a magnetic field almost perpendicular to a plane formed by the parallel wirings is generated between the parallel wirings located in the parallel wiring sections. This magnetic field is intensified by the magnetic core, and is capable of being detected by the magnetism detection unit arranged between the parallel wirings.

In this example, a pair of walls facing each other, which are portions of the magnetic core, is formed such that a distance between the walls in a part between the parallel wirings, particularly, in the center between the parallel wirings, is the same as or longer than a distance in other parts. As such, the distance between the pair of walls, particularly in the center part, is not set to be shorter compared with that in other parts. Accordingly, even if an external magnetic field in a direction perpendicular to the plane formed by the parallel wirings is generated outside the magnetic core, it is possible to reduce the intensity of the external magnetic field passing through the space between the pair of walls where the magnetism detection unit is provided, so that detection of the external magnetic field by the magnetism detection unit can be suppressed. Consequently, it is possible to provide a highly accurate current sensor in which cost reduction can be achieved by simplifying the shape of the magnetic core, and detection of external magnetic noise can be suppressed. In particular, by forming the inner surfaces of the pair of walls to be flat and parallel to the plane formed by the parallel wirings located in the parallel wiring sections, the distance between them can be constant, whereby detection of external magnetic noise can be reduced and the shape of the magnetic core can be more simplified.

Further, in the current sensor, the current detection unit includes, a coil which is arranged within the magnetic core, and when electric current flows in the coil, generates a magnetic field in a direction perpendicular to the plane formed by the parallel wirings located in the parallel wiring sections, and a coil control unit which controls electric current to be flown in the coil. The coil control unit controls the electric current flows in the coil such that the coil generates another magnetic field in a direction opposite to the magnetic field detected by the magnetism detection unit so as to offset the magnetic field, and detects electric current flowing in the current-measured wiring based on the electric current flowing in the coil.

Thereby, as a value of the electric current to be flown in the coil becomes a value in proportion to the electric current flowing in the current-measured wiring, electric current can be measured easily with high accuracy.

Further, in the current sensor, a plane with an element for detecting a magnetic field of the magnetism detection unit is arranged at the center inside the coil.

Thereby, a magnetic field which is generated when electric current flows in the coil can be generated in the vicinity of the element forming surface of the magnetism detection unit. As such, it is possible to generate, by the coil, a magnetic field which offsets the magnetic field generated by the electric current flowing in the current-measured wiring in the vicinity of the element forming surface, whereby electric current can be measured with higher accuracy.

Further, in the current sensor, the current-measured wiring, and the magnetism detection unit and the coil are respectively mounted on the top surface and the back surface of the same substrate, and are insulated from each other. Thereby, the current-measured wiring and the coil, in which electric current flows, can be arranged to be insulated reliably while maintaining the above-described functions.

Further, in the current sensor, the magnetic core is formed in an annular shape, and a substrate for mounting the current-measured wiring and the magnetism detection unit has notches to which another pair of walls linking the pair of walls of the magnetic core are able to be inserted respectively. Thereby, the magnetic core can be easily mounted such that the current-measured wiring and the magnetism detection unit are positioned between a pair of plate surfaces of the ring magnetic core.

Further, in the current sensor, a width of at least one wall of the pair of walls of the magnetic core is formed to be larger than a width of another wall linking the pair of walls. Thereby, a side of the direction of a magnetic field detectable by the magnetism detection unit can be covered largely with the magnetic core, so that external magnetic field noise with respect to the magnetism detection unit can be blocked more effectively.

Further, in the current sensor, a shield is provided within the magnetic core, the shield being opened in a direction perpendicular to the plane formed by the parallel wirings located in the parallel wiring sections, and blocking an external magnetic field in a direction parallel to the plane. Thereby, the external magnetic field in the direction parallel to the plane formed by the parallel wirings can be blocked more reliably.

Further, in the current sensor, the magnetic detection unit includes, a bridge circuit including a plurality of magneto resistive effect elements connected with each other, the bridge circuit being capable of detecting a differential voltage between predetermined connecting points, the magneto resistive effect elements outputting resistance values which vary in accordance with a direction of a magnetic field to be input and being arranged such that fixed magnetization directions of the magneto resistive effect elements are in the same direction; and a magnetic body arranged in the vicinity of the bridge circuit and changing the direction of the magnetic field to be input to the magneto resistive effect elements. The current detection unit detects electric current flowing in the current-measured wiring based on an operating voltage detected from the bridge circuit.

Further, in the current sensor, the bridge circuit includes four magneto resistive effect elements, and two element forming regions, in each of which a pair of the magneto resistive effect elements not adjacently-connected with each other in the bridge circuit are formed in almost the same area, are provided corresponding to respective pairs of the magneto resistive effect elements. The magnetic body is arranged between the two element forming regions.

Further, in the current sensor, the magnetic body is disposed on a plane where the magneto resistive effect elements are formed. Further, the magnetic body is made of a soft magnetic material, and the magneto resistive effect elements and the magnetic body are arranged on the same straight line along the fixed magnetization direction of the magneto resistive effect elements.

With this configuration, as the bridge circuit is constituted of a plurality of magneto resistive effect elements arranged such that the fixed magnetization direction thereof are in the same direction, the bridge circuit can be formed on a single chip, whereby variations in resistance values of the respective magneto resistive effect elements can be reduced. Further, as a magnetic body is arranged in the vicinity of the bridge circuit, the direction of the magnetic field existing around the magnetic sensor with respect to the magneto resistive effect elements having the same fixed magnetization direction is changed. Thereby, the external magnetic field in one direction can be changed into different directions between the magneto resistive effect elements, in accordance with the arrangement of the magnetic body. For example, two element forming regions, in each of which a pair of the magneto resistive effect elements not adjacently-connected with each other in the bridge circuit are formed in almost the same area, are provided corresponding to respective pairs of the magneto resistive effect elements, and the magnetic body is arranged such that the magnetic field enters one region in the fixed magnetization direction and enters the other region in the opposite direction. With this configuration, as a large differential voltage can be output from the bridge circuit, accuracy of detecting the magnetic field in one direction can be improved, so that measurement accuracy of electric current flowing in the current-measured wiring can be improved.

The above-described current sensor may be manufactured by a manufacturing method according to another aspect of the present invention, which includes, with respect to a current-measured wiring including parallel wiring sections in which portions of the same wiring are arranged in parallel such that electric current to be measured flows in the parallel wiring portions in opposite directions each other, arranging a magnetism detection unit between parallel wirings located in the parallel wiring sections, the magnetism detection unit detecting a magnetic field in a direction perpendicular to a plane formed by the parallel wirings; connecting the magnetism direction unit to a current detection unit which detects electric current flowing in the current-measured wiring based on the magnetic field detected by the magnetism detection unit; providing a magnetic core to surround the parallel wiring sections so as to intensify a magnetic field generated around the parallel wirings located in the parallel wiring sections when electric current flows in the parallel wirings, the magnetic core having a pair of walls facing each other over a plane formed by the parallel wirings, in which a distance between the pair of walls in a part located between the parallel wirings is the same as or longer than a distance in other parts, and when providing the magnetic core, arranging the magnetism detection unit between the pair of walls of the magnetic core.

Further, the method of manufacturing the current sensor, further includes, before providing the magnetic core, arranging a coil which generates, when electric current flows in the coil, a magnetic field in a direction perpendicular to the plane formed by the parallel wirings located in the parallel wiring sections, and connecting the coil to a coil control unit which controls the electric current flowing in the coil such that the coil generates another magnetic field in a direction opposite to the magnetic field detected by the magnetism detection unit so as to offset the magnetic field, and detects electric current flowing in the current-measured wiring based on the electric current flowing in the coil, and providing the magnetic core such that the coil is arranged within the magnetic core.

The current sensor according to the present invention measures electric current flowing in various current-measured devices, so that the measurement result can be used for controlling electric current of the devices. For example, such a measurement result can be used for control of a motor installed in an elevator or a machine tool, control of electric current in a welder, control of electric current in an electric vehicle, management of electric current in a building, and the like, so that the present invention has industrial applicability.

What is claimed is:

1. A current sensor comprising:
   a current-measured wiring including parallel wiring sections in which portions of a same wiring are arranged in parallel such that electric current to be measured flows in the parallel wiring sections in opposite directions each other;
   a magnetism detection unit which is arranged between parallel wirings located in the parallel wiring sections and detects a magnetic field in a direction perpendicular to a plane formed by the parallel wirings;
   a current detection unit which detects electric current flowing in the current-measured wiring, based on the magnetic field detected by the magnetism detection unit; and
   a magnetic core surrounding the parallel wiring sections so as to intensify a magnetic field generated around the parallel wirings located in the parallel wiring sections when electric current flows in the parallel wirings, wherein
   the magnetic core, being configured such that a belt-like body of a constant width is formed to be in an annular shape with rectangular side faces, has a pair of walls facing each other over the plane formed by the parallel wirings and another pair of walls linking the pair of walls of the magnetic core, in which respective whole inner surfaces of the pair of walls are formed to be flat and parallel to the plane formed by the parallel wirings,
   the magnetism detection unit is arranged between the pair of walls of the magnetic core, and
   the current sensor further comprises, within the magnetic core, a shield which is opened in a direction perpendicular to the plane formed by the parallel wirings located in the parallel wiring sections, and blocks an external magnetic field in a direction parallel to the plane.

2. The current sensor according to claim 1, wherein
   the magnetic core is formed in an annular shape, and
   a substrate for mounting the current-measured wiring and the magnetism detection unit has notches to which another pair of walls linking the pair of walls of the magnetic core are able to be inserted respectively.

3. The current sensor according to claim 1, wherein a width of at least one wall of the pair of walls of the magnetic core is formed to be larger than a width of another wall linking the pair of walls.

4. A current measured device comprising the current sensor according to claim 1.

5. A current sensor comprising:
   a current-measured wiring including parallel wiring sections in which portions of a same wiring are arranged in parallel such that electric current to be measured flows in the parallel wiring sections in opposite directions each other;
   a magnetism detection unit which is arranged between parallel wirings located in the parallel wiring sections and detects a magnetic field in a direction perpendicular to a plane formed by the parallel wirings;
   a current detection unit which detects electric current flowing in the current-measured wiring, based on the magnetic field detected by the magnetism detection unit; and
   a magnetic core surrounding the parallel wiring sections so as to intensify a magnetic field generated around the parallel wirings located in the parallel wiring sections when electric current flows in the parallel wirings, wherein the magnetic core has a pair of walls facing each other over the plane formed by the parallel wirings, in which respective whole inner surfaces of the pair of walls are formed to be flat and parallel to the plane formed by the parallel wirings, the magnetism detection unit is arranged between the pair of walls of the magnetic core the current detection unit includes:
  a coil which is arranged within the magnetic core, and when electric current flows in the coil, generates a magnetic field in a direction perpendicular to the plane formed by the parallel wirings located in the parallel wiring sections, and
  a coil control unit which controls electric current to be flown in the coil, and the coil control unit controls the electric current flows in the coil such that the coil generates another magnetic field in a direction opposite to the magnetic field detected by the magnetism detection unit so as to offset the magnetic field, and detects electric current flowing in the current-measured wiring based on the electric current flowing in the coil.

6. The current sensor according to claim 5, wherein a plane with an element for detecting a magnetic field of the magnetism detection unit is arranged at the center inside the coil.

7. The current sensor according to claim 5, wherein the current-measured wiring, and the magnetism detection unit and the coil are respectively mounted on a top surface and a back surface of a same substrate, and are insulated from each other.

8. A current sensor comprising:
  a current-measured wiring including parallel wiring sections in which portions of a same wiring are arranged in parallel such that electric current to be measured flows in the parallel wiring sections in opposite directions each other;
  a magnetism detection unit which is arranged between parallel wirings located in the parallel wiring sections and detects a magnetic field in a direction perpendicular to a plane formed by the parallel wirings;
  a current detection unit which detects electric current flowing in the current-measured wiring, based on the magnetic field detected by the magnetism detection unit; and
  a magnetic core surrounding the parallel wiring sections so as to intensify a magnetic field gerated around the parallel wirings located in the parallel wiring sections when electric current flows in the parallel wirings, wherein the magnetic core, being configured such that a belt-like body of a constant width is formed to be in an annular shape with rectangular side faces, has a pair of walls facing each other over the plane formed by the parallel wirings and another pair of walls linking the pair of walls of the magnetic core, in which respective whole inner surfaces of he pair of walls are formed to be flat and sarallel to the slave formed by the parallel wirings, the magnetism detection unit is arranged between the pair of walls of the magnetic core, the magnetic detection unit includes:
  a bridge circuit including a plurality of magneto resistive effect elements connected with each other, the bridge circuit being capable of detecting a differential voltage between predetermined connecting points, the magneto resistive effect elements outputting resistance values which vary in accordance with a direction of a magnetic field to be input and being arranged such that fixed magnetization directions of the magneto resistive effect elements are in a same direction; and
  a magnetic body arranged in the vicinity of the bridge circuit and changing the direction of the magnetic field to be input to the magneto resistive effect elements, and the current detection unit detects electric current flowing in the current-measured wiring based on an operating voltage detected from the bridge circuit.

9. The current sensor according to claim 8, wherein
the bridge circuit includes four magneto resistive effect elements, two element forming regions, in each of which a pair of the magneto resistive effect elements not adjacently-connected with each other in the bridge circuit are formed in almost the same area, are provided corresponding to respective pairs of the magneto resistive effect elements, and the magnetic body is arranged between the two element forming regions.

10. The current sensor according to claim 9, wherein the magnetic body is disposed on a plane where the magneto resistive effect elements are formed.

11. The current sensor according to claim 8, wherein the magnetic body is made of a soft magnetic material.

12. The current sensor according to claim 8, wherein the magneto resistive effect elements and the magnetic body are arranged on a same straight line along the fixed magnetization direction of the magneto resistive effect elements.

13. A method of assembling a current sensor, the method comprising:
  with respect to a current-measured wiring including parallel wiring sections in which portions of a same wiring are arranged in parallel such that electric current to be measured flows in the parallel wiring sections in opposite directions each other, arranging a magnetism detection unit between parallel wirings located in the parallel wiring sections, the magnetism direction unit detecting a magnetic field in a direction perpendicular to a plane formed by the parallel wirings;
  connecting the magnetism direction unit to a current detection unit which detects electric current flowing in the current-measured wiring based on the magnetic field detected by the magnetism detection unit;
  providing a magnetic core to surround the parallel wiring sections so as to intensify a magnetic field generated around the parallel wirings located in the parallel wiring sections when electric current flows in the parallel wirings, the magnetic core, being configured such that a belt-like body of a constant width is formed to be in an annular shape with rectangular side faces, having a pair of walls facing each other over a plane formed by the parallel wirings and another pair of walls linking the pair of walls of the magnetic core, in which respective whole inner surfaces of the pair of walls are formed to be flat and parallel to the plane formed by the parallel wirings;
  when providing the magnetic core, arranging the magnetism detection unit between the pair of walls of the magnetic core;
  before providing the magnetic core, arranging a coil which generates, when electric current flows in the magnetic coil, a magnetic field in a direction perpendicular to the plane formed by the parallel wirings located in the parallel wiring sections;

connecting the coil to a coil control unit which controls the electric current flowing in the coil such that the coil generates another magnetic field in a direction opposite to the magnetic field detected by the magnetism detection unit so as to offset the magnetic field, and detects electric current flowing in the current-measured wiring based on the electric current flowing in the coil; and providing the magnetic core such that the coil is arranged within the magnetic core.

* * * * *